US011065859B2

(12) United States Patent
Lee et al.

(10) Patent No.: US 11,065,859 B2
(45) Date of Patent: Jul. 20, 2021

(54) DEVICE AND METHOD FOR DISASSEMBLING SOLAR CELL MODULE

(71) Applicant: KOREA INSTITUTE OF ENERGY RESEARCH, Daejeon (KR)

(72) Inventors: Jin Seok Lee, Sejong-si (KR); Young Soo Ahn, Daejeon (KR); Gi Hwan Kang, Sejong-si (KR); Jun Kyu Lee, Daejeon (KR)

(73) Assignee: KOREA INSTITUTE OF ENERGY RESEARCH, Daejeon (KR)

( * ) Notice: Subject to any disclaimer, the term of this patent is extended or adjusted under 35 U.S.C. 154(b) by 70 days.

(21) Appl. No.: 16/538,378

(22) Filed: Aug. 12, 2019

(65) Prior Publication Data
US 2020/0247106 A1    Aug. 6, 2020

(30) Foreign Application Priority Data

Feb. 1, 2019   (KR) .................... 10-2019-0013523
Jun. 24, 2019  (KR) .................... 10-2019-0074839
(Continued)

(51) Int. Cl.
*B32B 43/00*      (2006.01)
*H01L 31/18*      (2006.01)
(Continued)

(52) U.S. Cl.
CPC ............ *B32B 43/006* (2013.01); *H01L 31/18* (2013.01); *H02S 40/34* (2014.12); *B32B 2457/12* (2013.01); *G01B 21/08* (2013.01)

(58) Field of Classification Search
CPC ............ B32B 2457/12; Y10T 29/49355; Y10T 29/49318; Y10T 29/49815; Y10T 29/53;
(Continued)

(56) References Cited

U.S. PATENT DOCUMENTS

2018/0133720 A1*   5/2018   Lee ...................... B02C 23/38

FOREIGN PATENT DOCUMENTS

JP   2002-284127 A   10/2002
JP   2008-12450 A    1/2008
(Continued)

OTHER PUBLICATIONS

Takahashi English translation JP2015110201 (Year: 2015).*

*Primary Examiner* — Jason L Vaughan
*Assistant Examiner* — Amanda Kreiling
(74) *Attorney, Agent, or Firm* — Birch, Stewart, Kolasch & Birch, LLP

(57) ABSTRACT

A solar cell module disassembling device is disclosed. The device of present invention comprises a frame unit, wherein a laminated panel having a first panel and a second panel is mounted on the frame unit, and wherein the first and second panels are stacked and bonded; a guide module, being elongated in a forward and backward direction; a scraper unit, being movably coupled to the guide module, having a blade module, wherein the blade module moves in the forward and backward direction and presses the laminated panel and disassembles the laminated panel; and a transfer unit, being coupled to the scraper unit, delivering a driving force to the scraper unit, transferring the scraper unit.

20 Claims, 40 Drawing Sheets

(30) Foreign Application Priority Data

Jul. 3, 2019 (KR) .................. 10-2019-0080288
Jul. 3, 2019 (KR) .................. 10-2019-0080289

(51) Int. Cl.
*H02S 40/34* (2014.01)
*G01B 21/08* (2006.01)

(58) Field of Classification Search
CPC ......... Y10T 29/53274; Y10T 29/53309; Y10T 29/534
See application file for complete search history.

(56) References Cited

FOREIGN PATENT DOCUMENTS

| | | | |
|---|---|---|---|
| JP | 2012-804 A | | 1/2012 |
| JP | 2014-116363 A | | 6/2014 |
| JP | 2015-110201 A | | 6/2015 |
| JP | 2015110201 A | * | 6/2015 |
| JP | 2016-203093 A | | 12/2016 |
| JP | 2018-63176 A | | 5/2018 |
| JP | 2018-86651 A | | 6/2018 |
| KR | 10-2013-0123925 A | | 11/2013 |
| KR | 10-2015-0075616 A | | 7/2015 |
| KR | 10-1542445 B1 | | 8/2015 |
| KR | 10-1842224 B1 | | 3/2018 |

* cited by examiner

[FIG. 1]
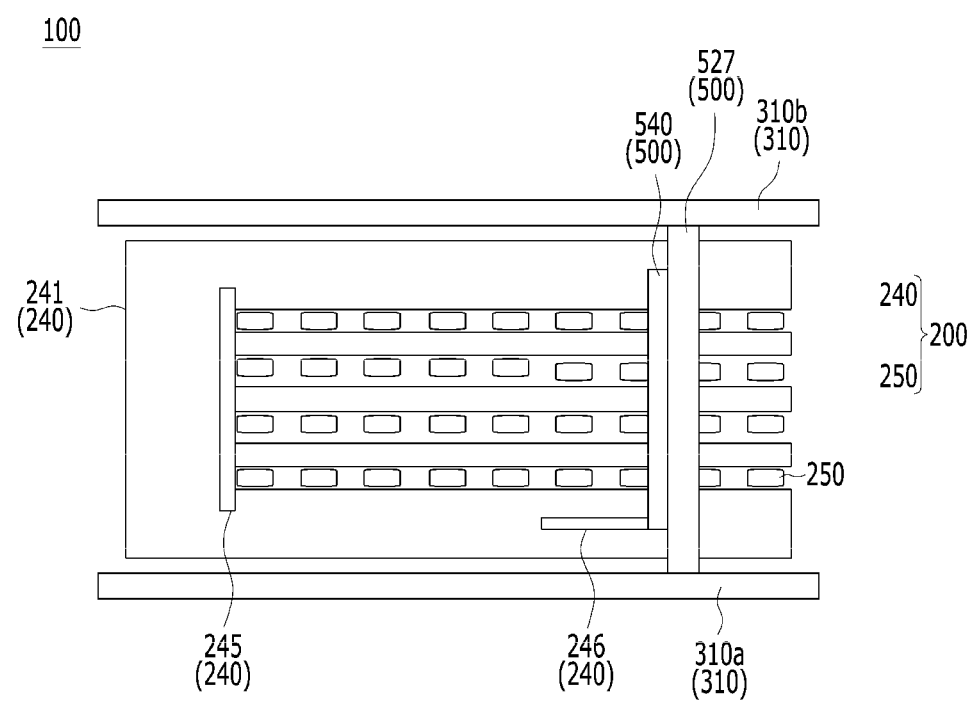

【FIG. 2】
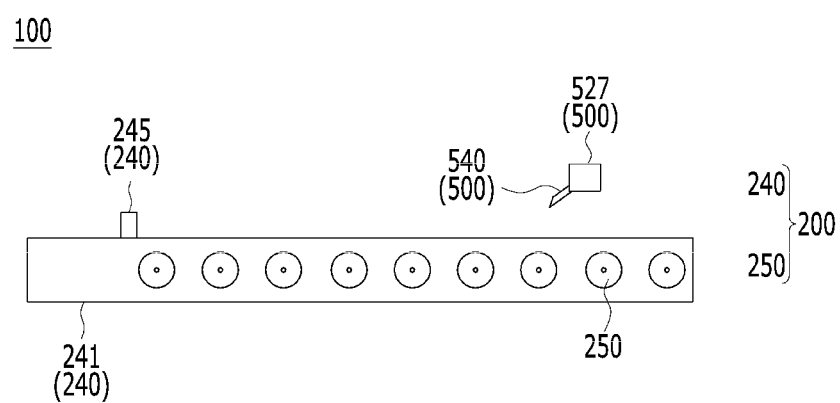

[FIG. 3]
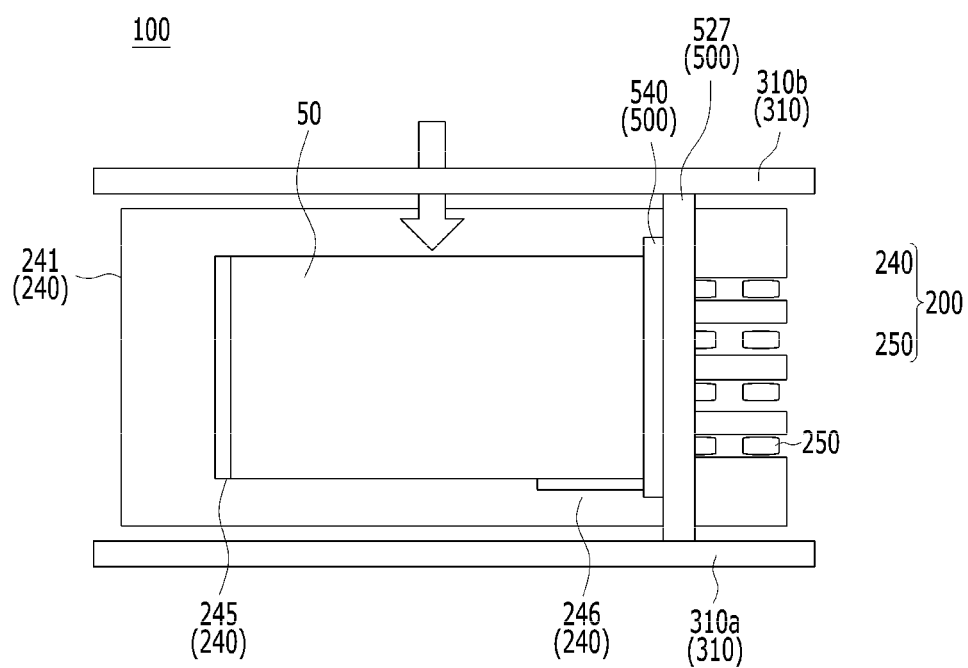

【FIG. 4】
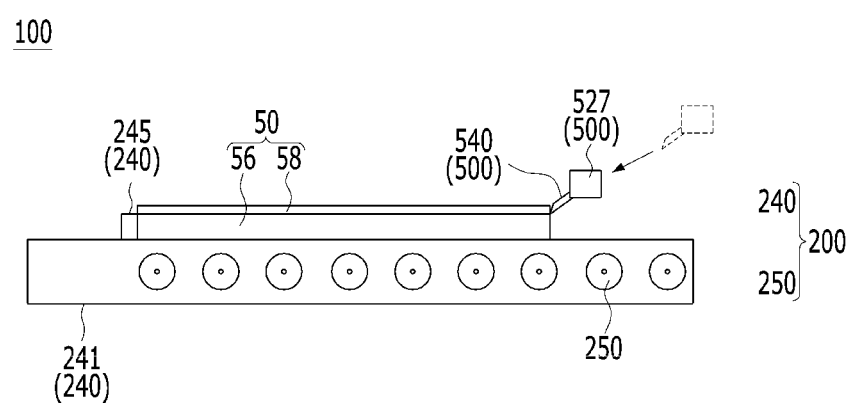

[FIG. 5]
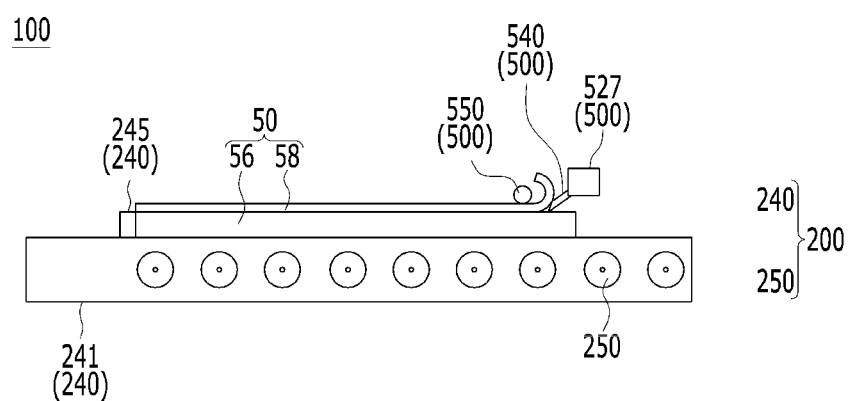

【FIG. 6】
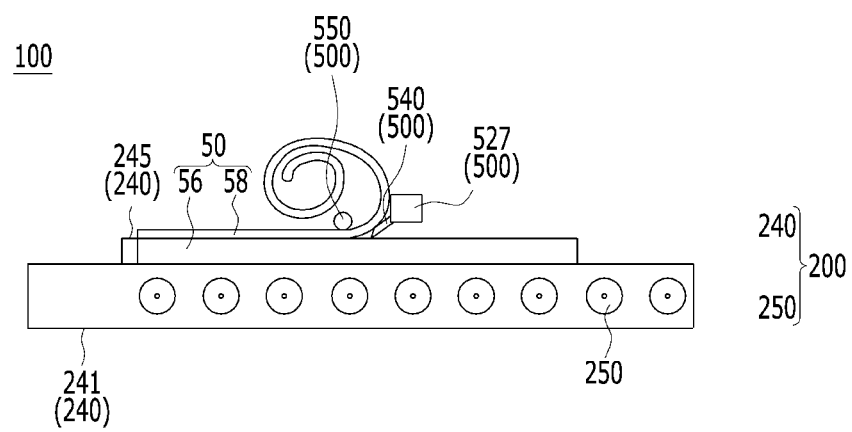

[FIG. 7]
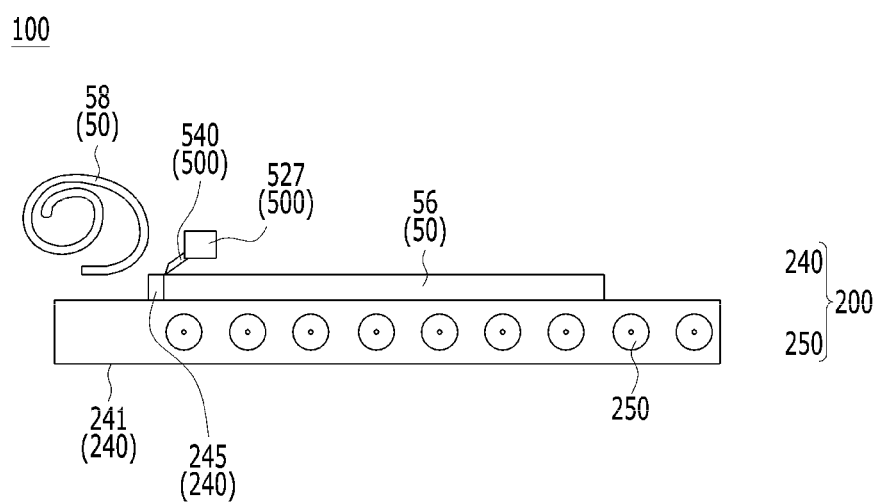

[FIG. 8]
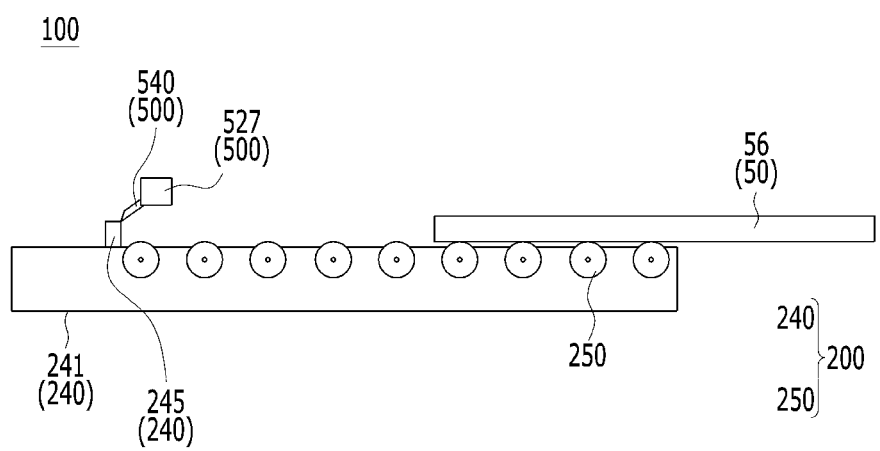

[FIG. 9]
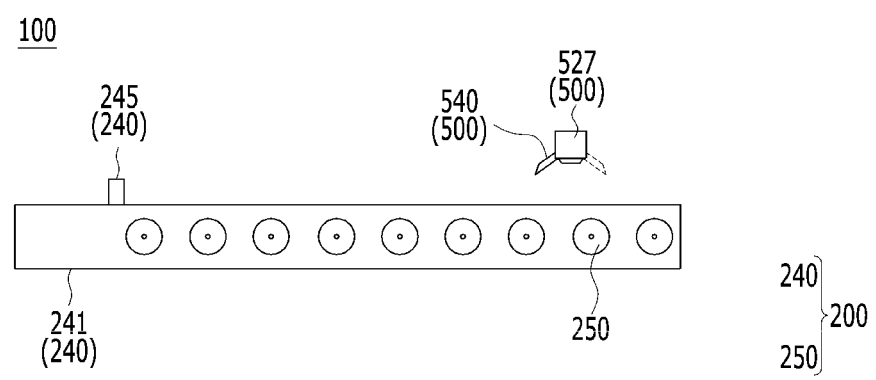

[FIG. 10]
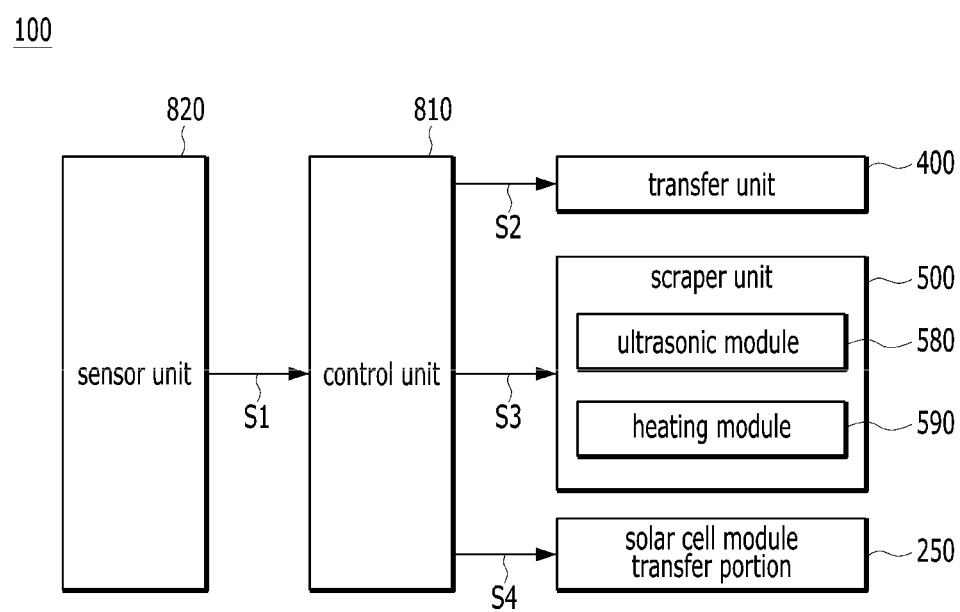

[FIG. 11]
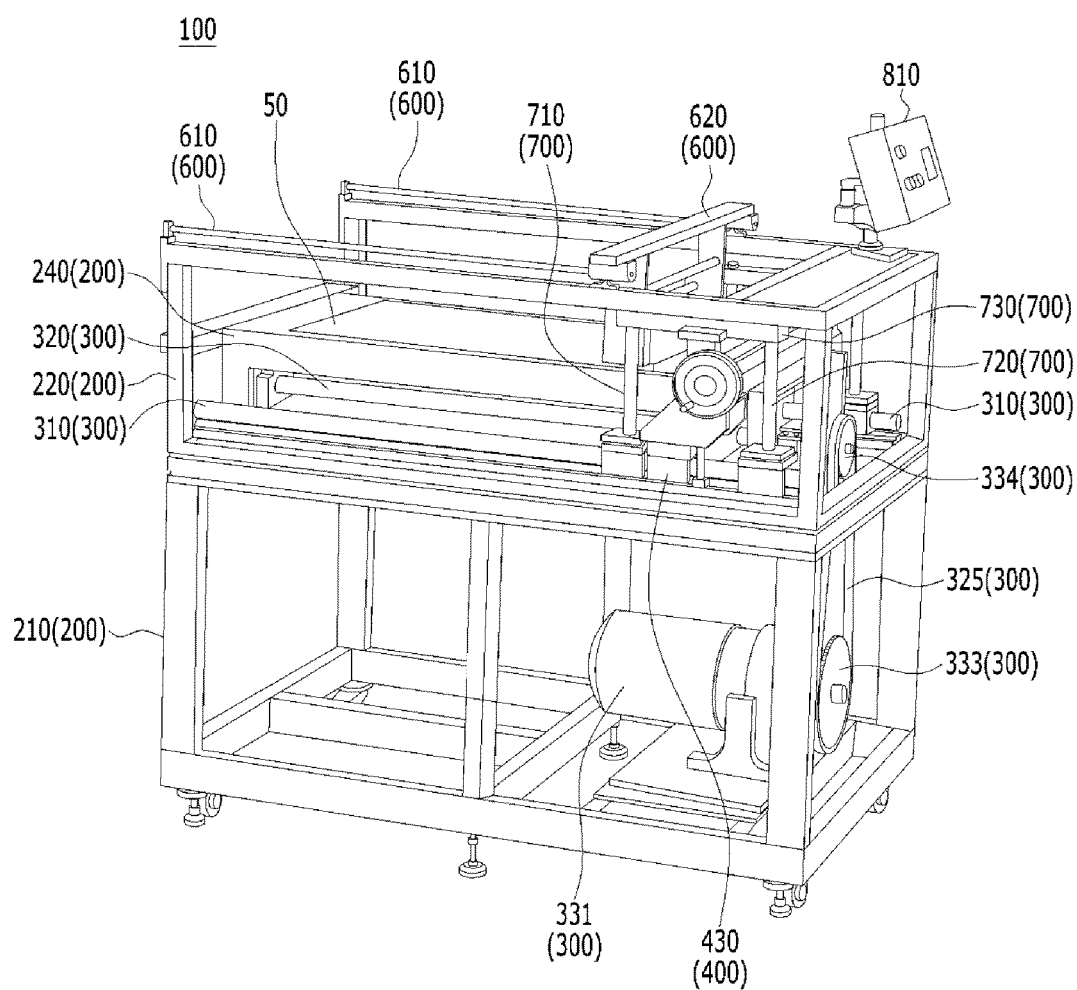

[FIG. 12]
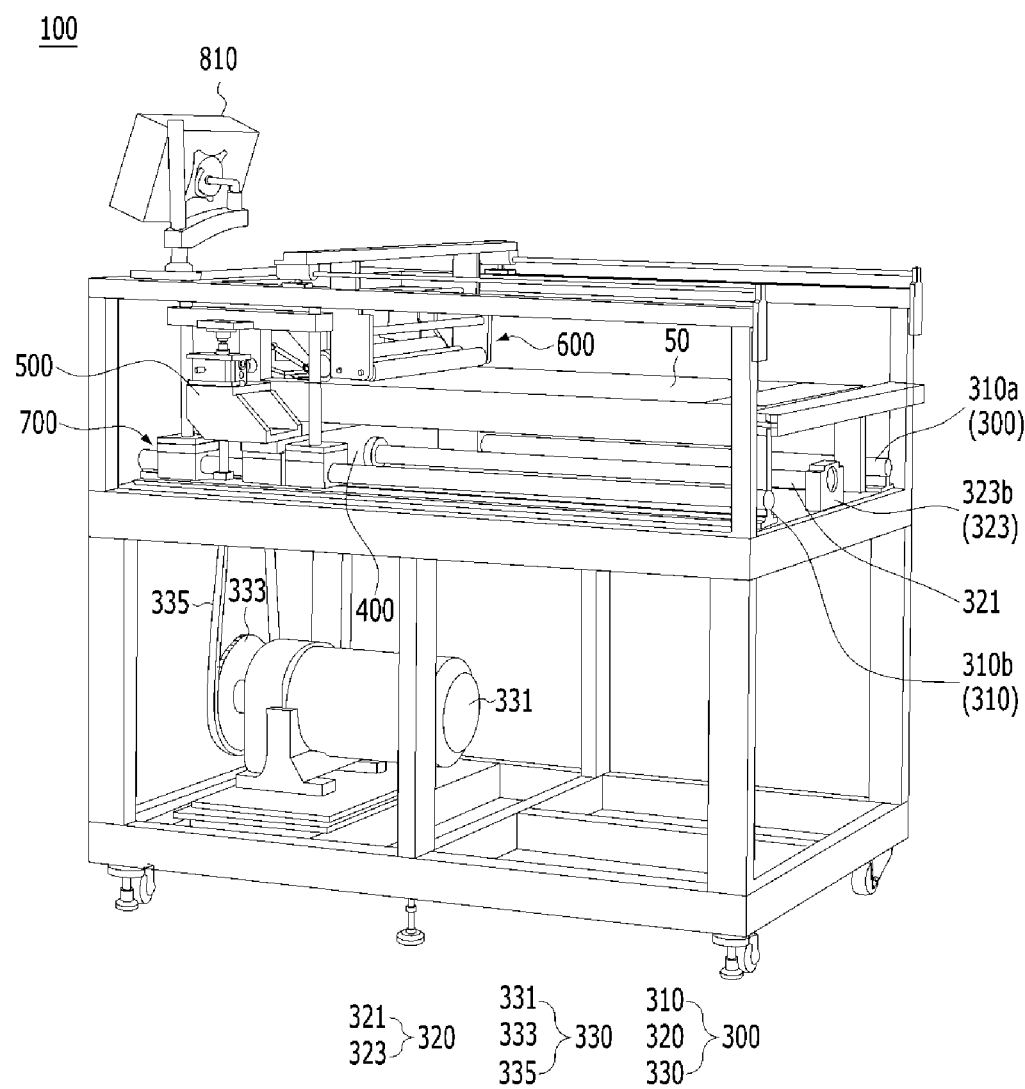

[FIG. 13]
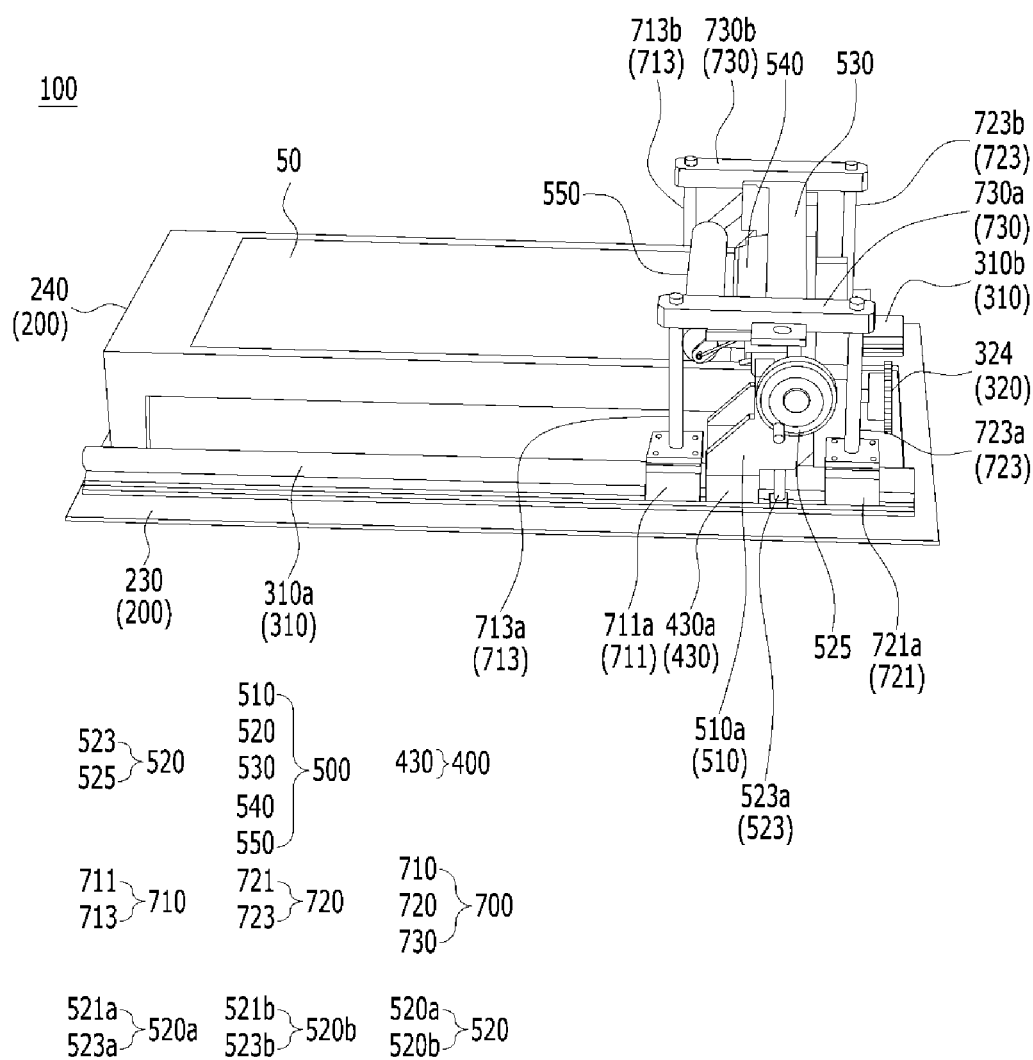

[FIG. 14]
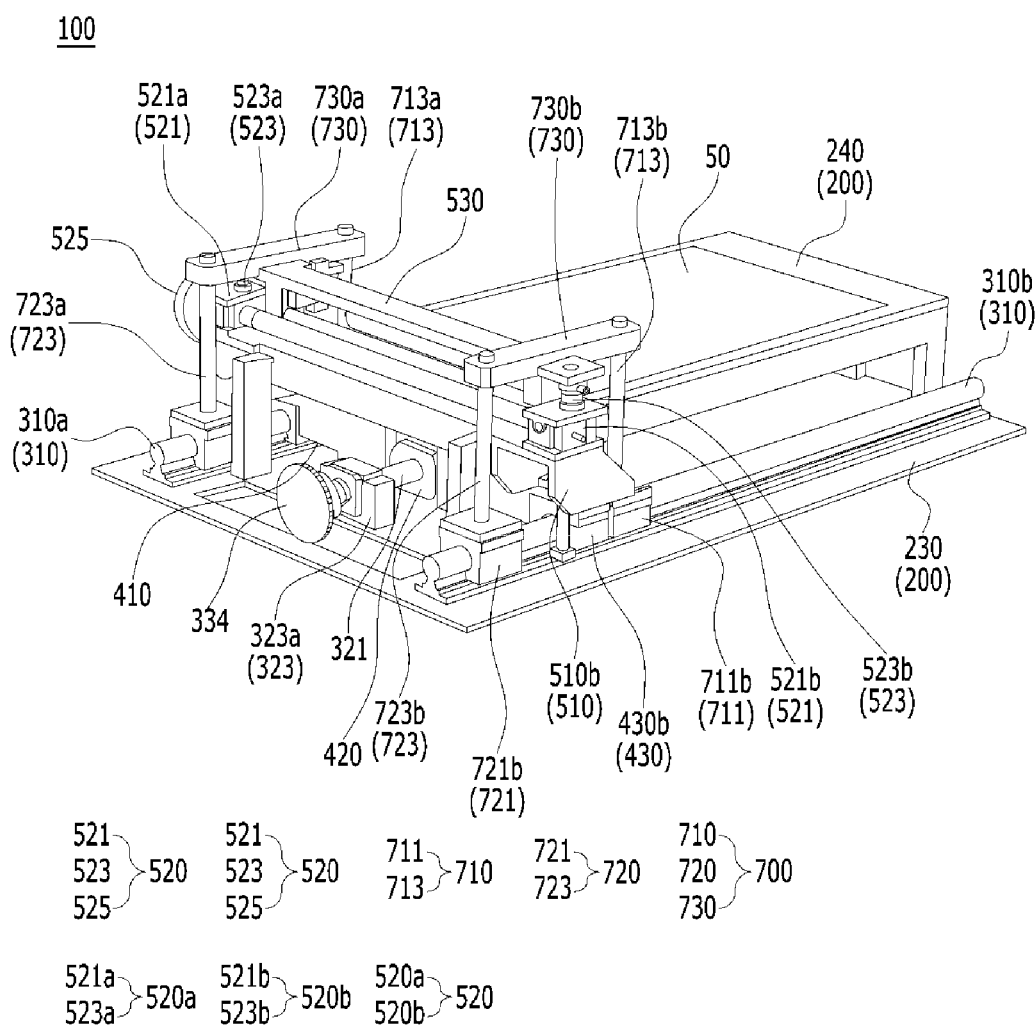

[FIG. 15]
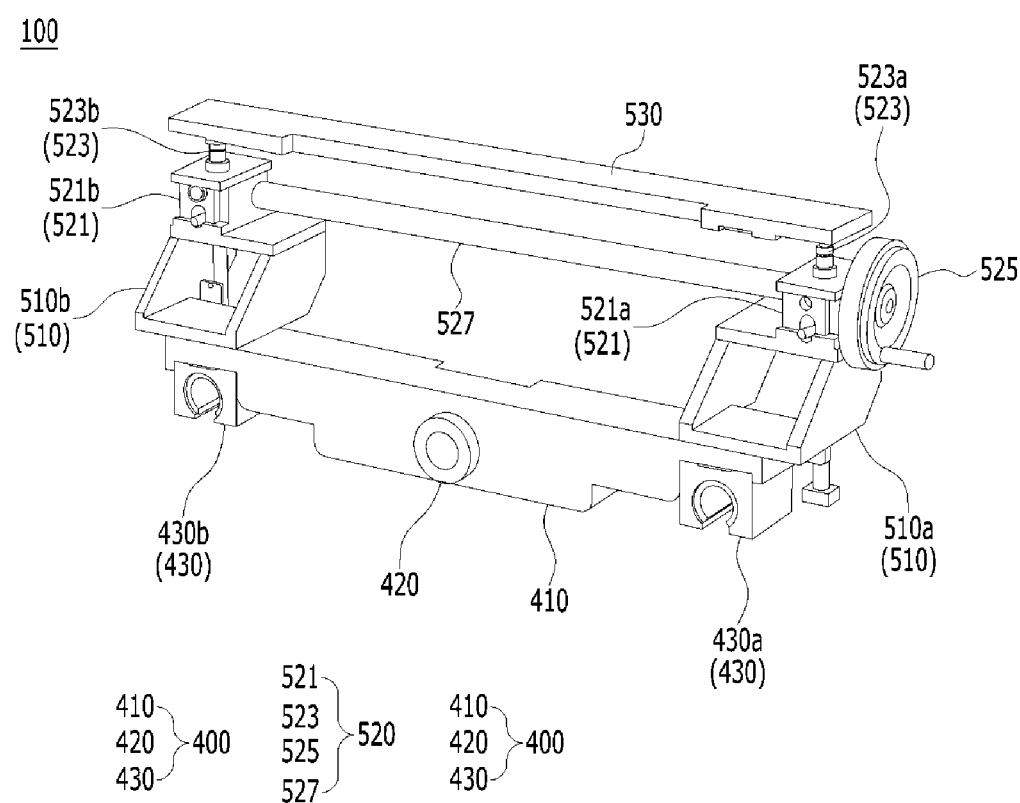

[FIG. 16]
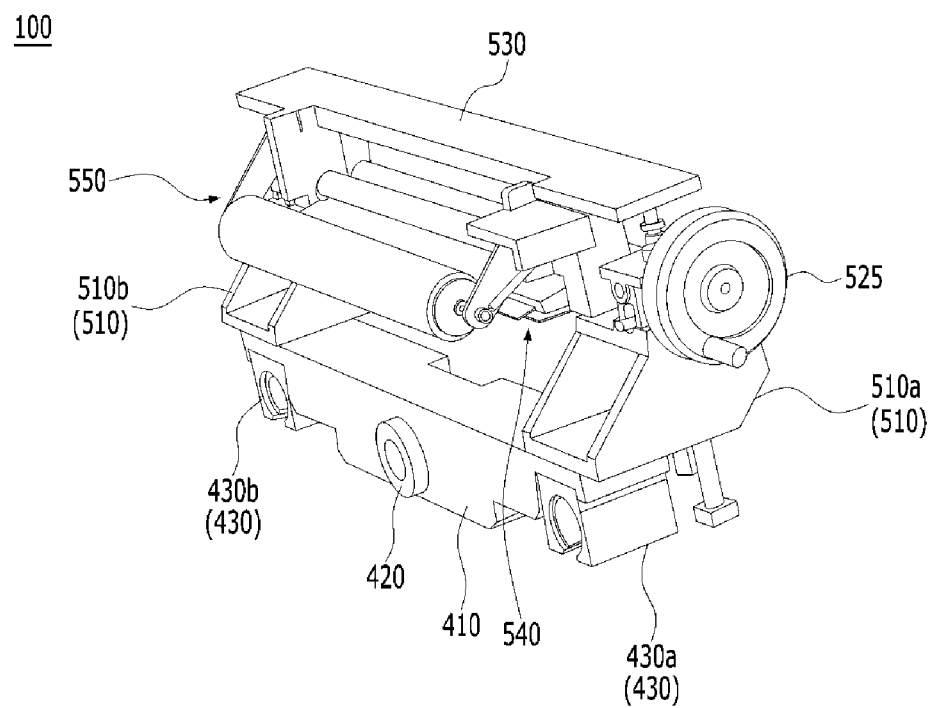

[FIG. 17]
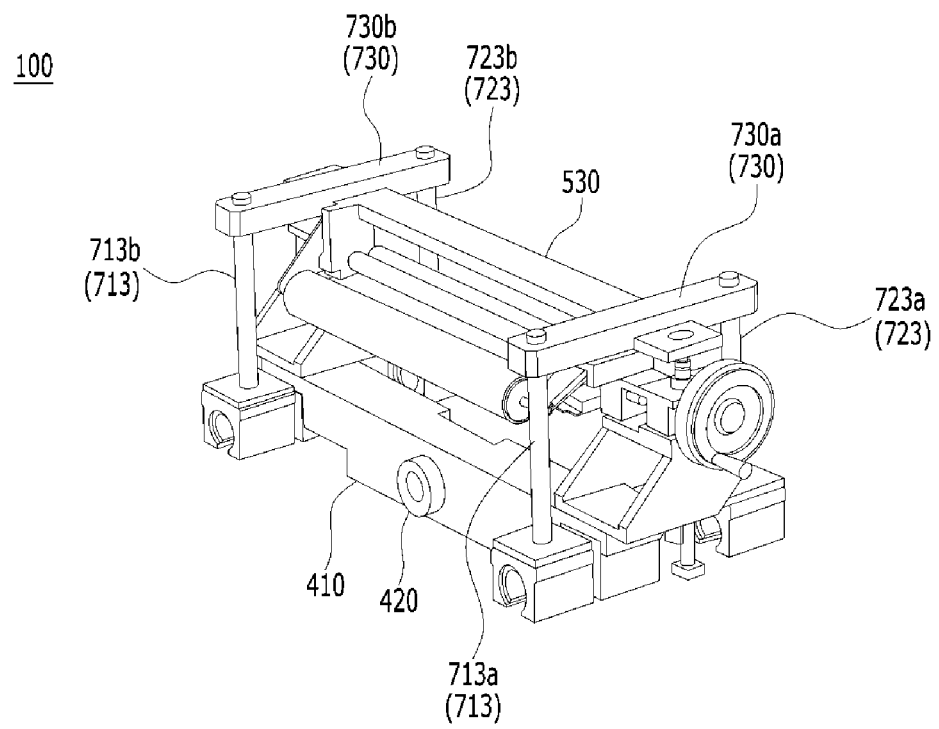

[FIG. 18]
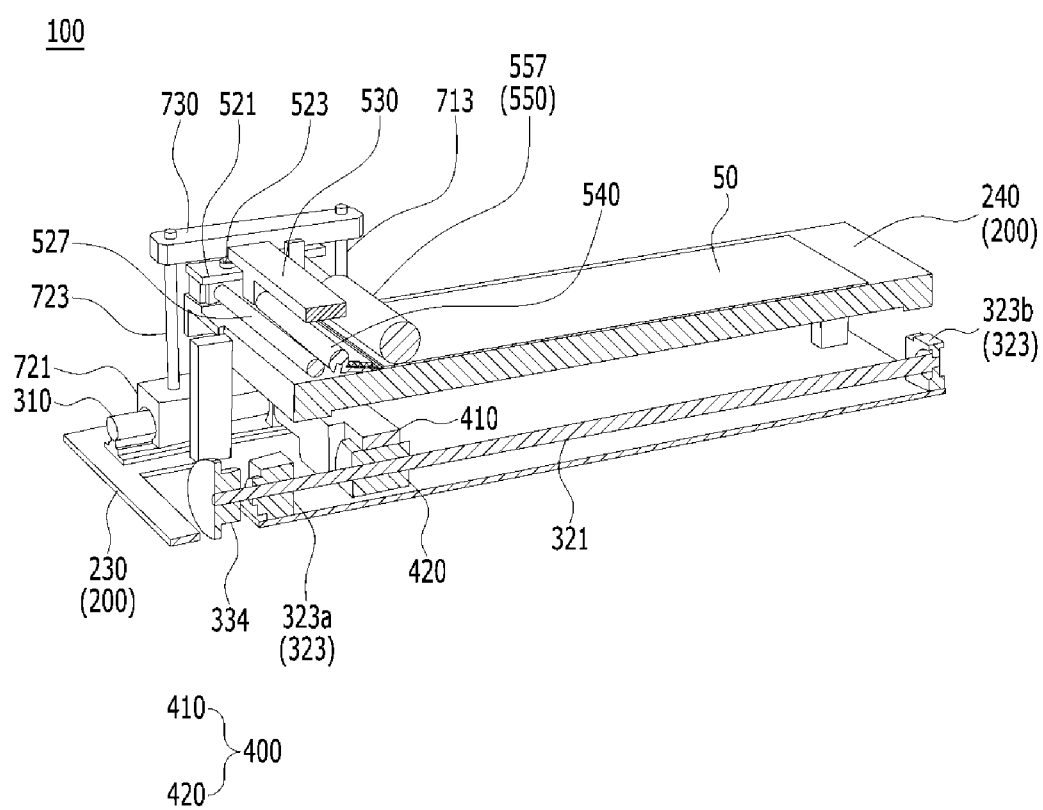

[FIG. 19]
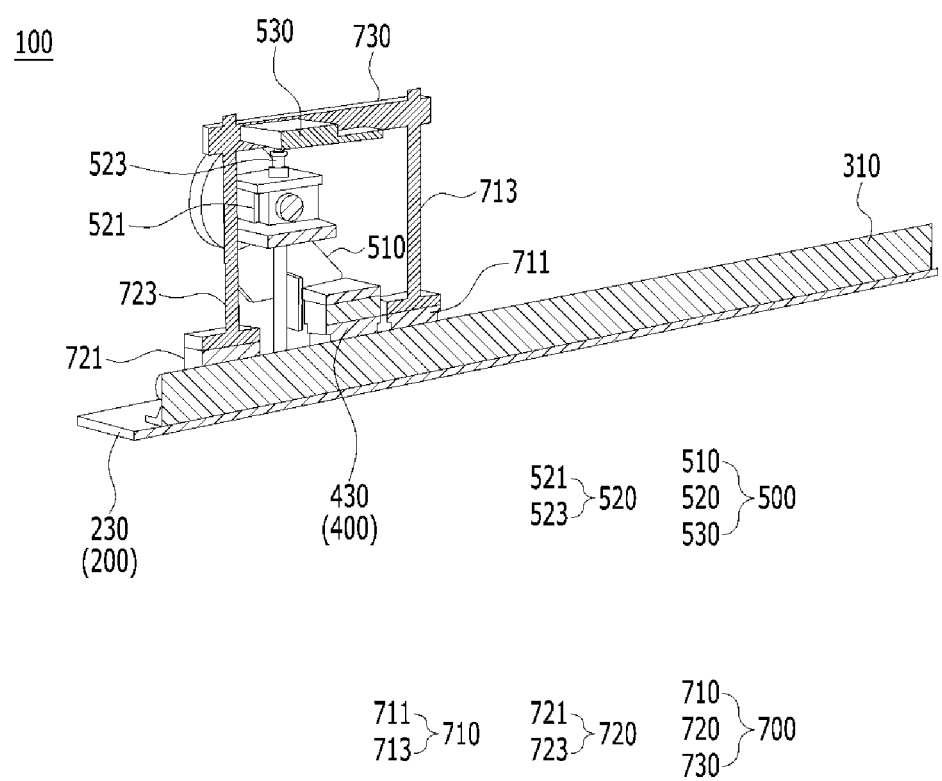

[FIG. 20]
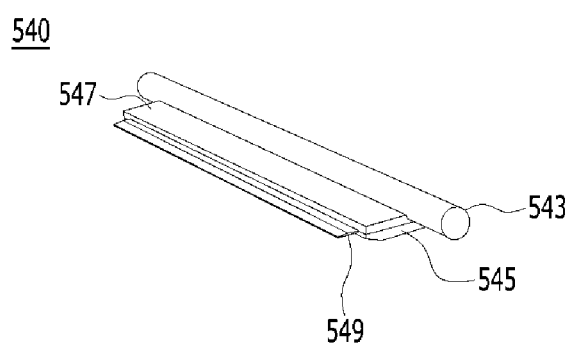

[FIG. 21]
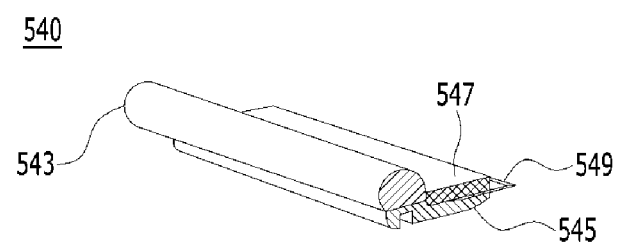

[FIG. 22]
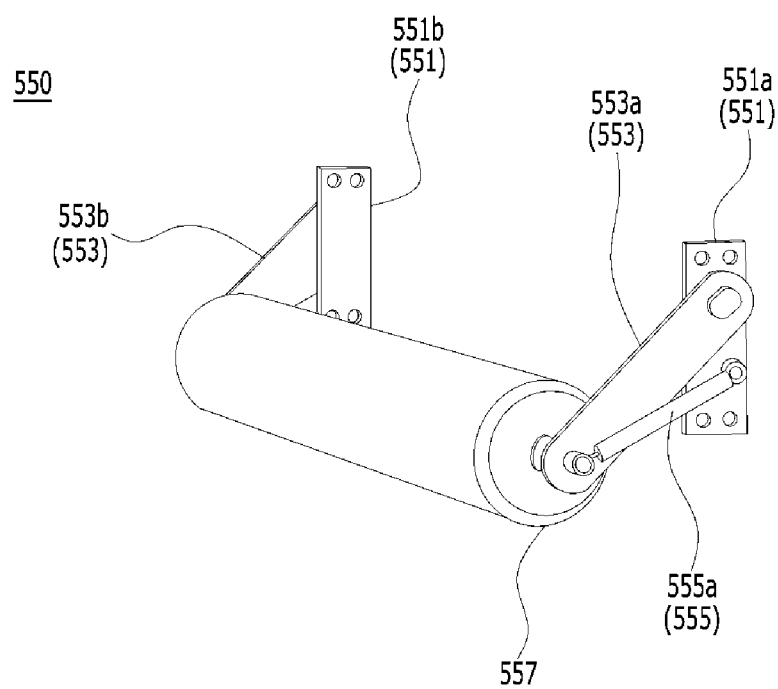

[FIG. 23]
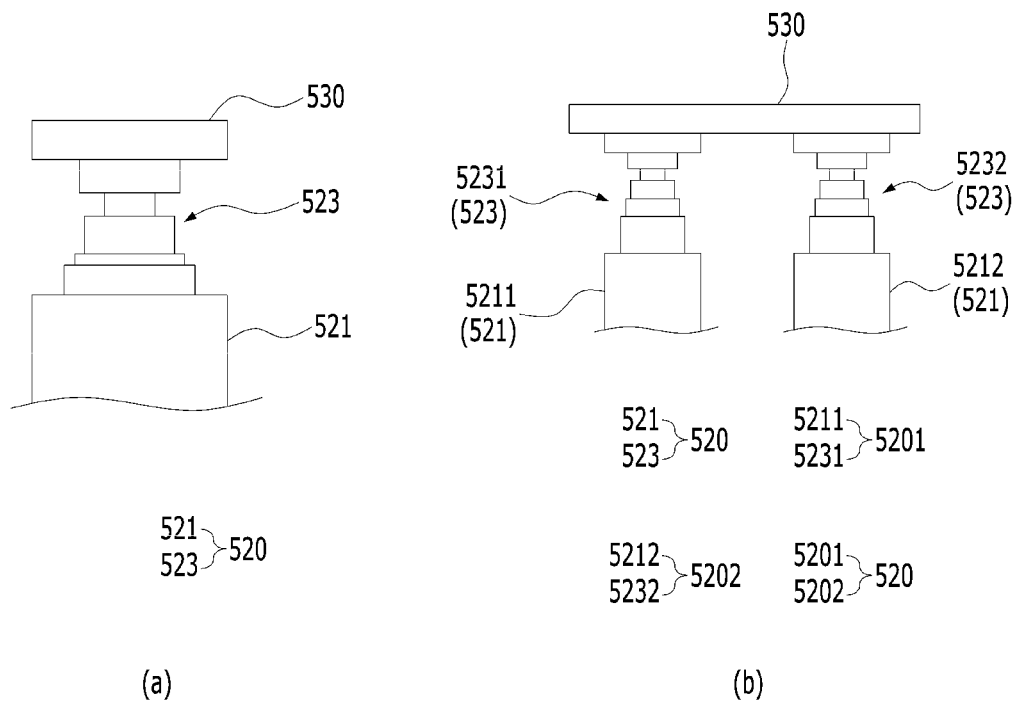
(a)                             (b)

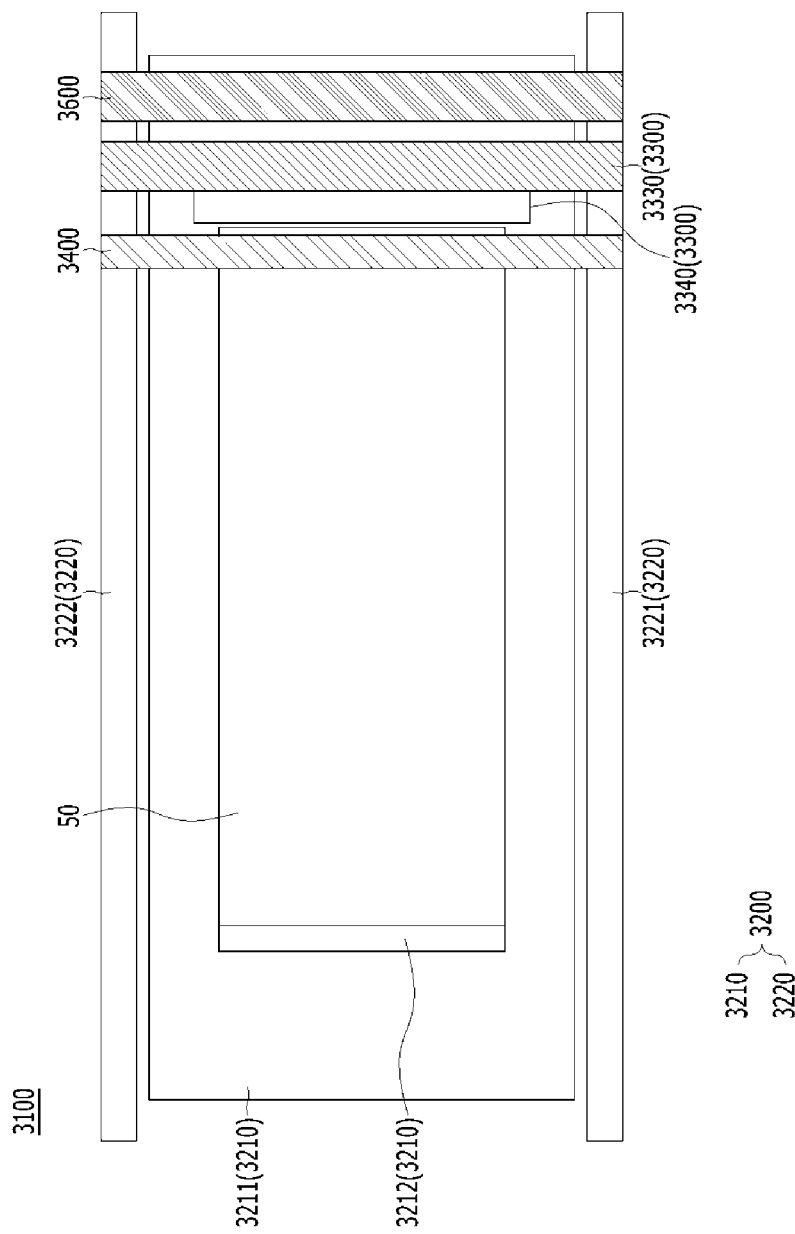
[FIG. 24]

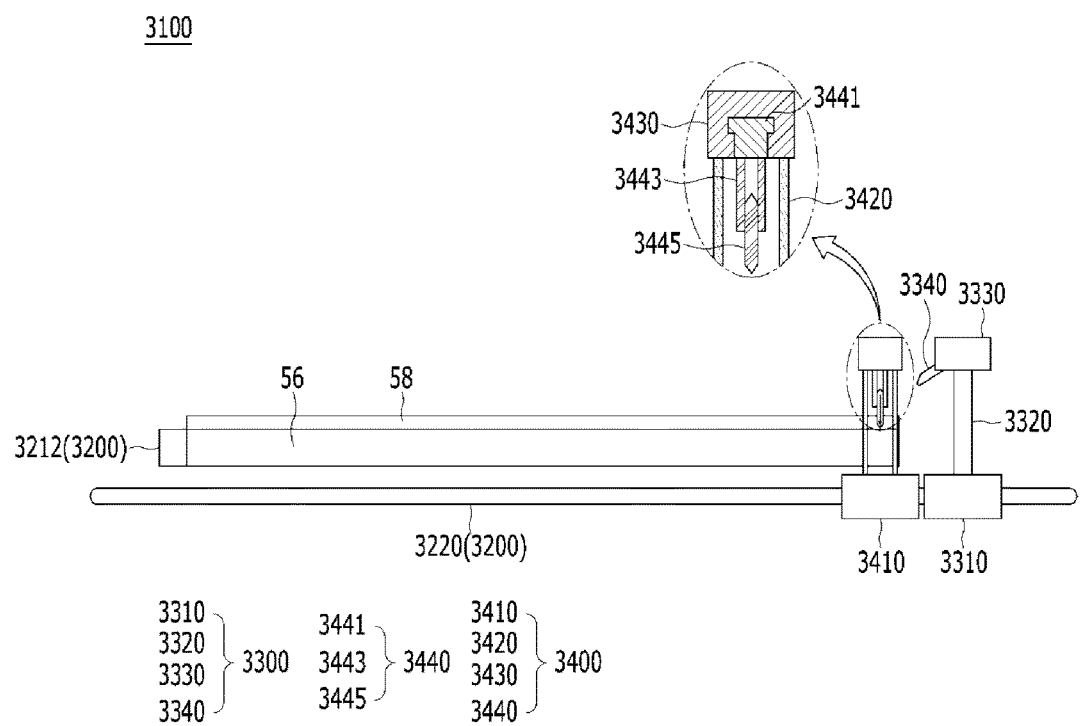
[FIG. 25]

[FIG. 26]
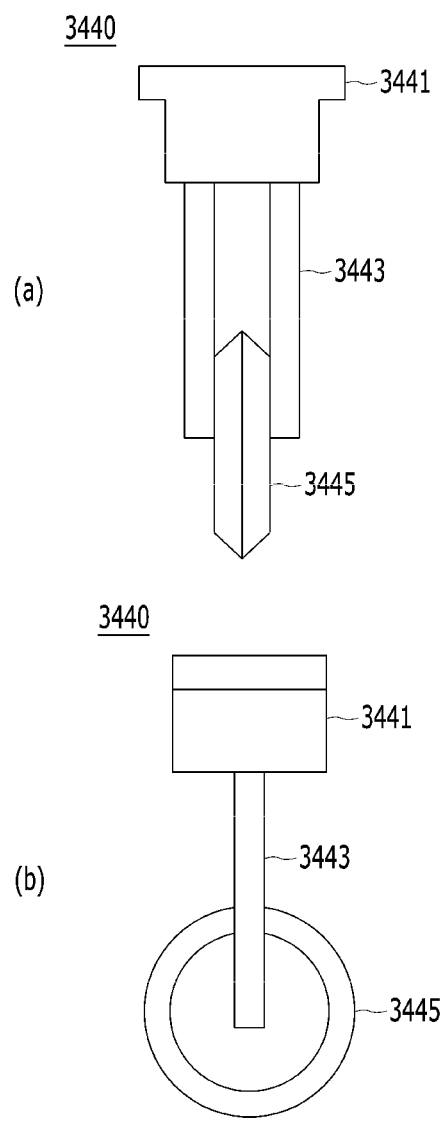

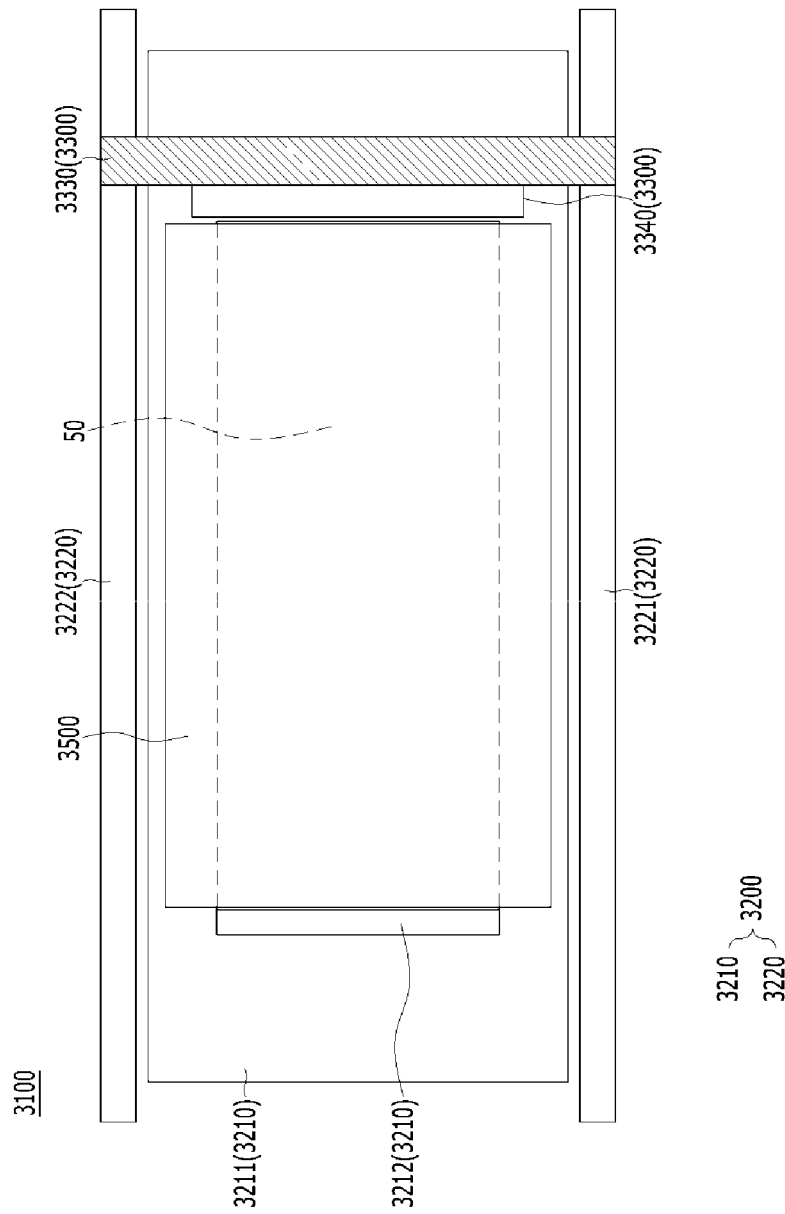
[FIG. 27]

[FIG. 28]
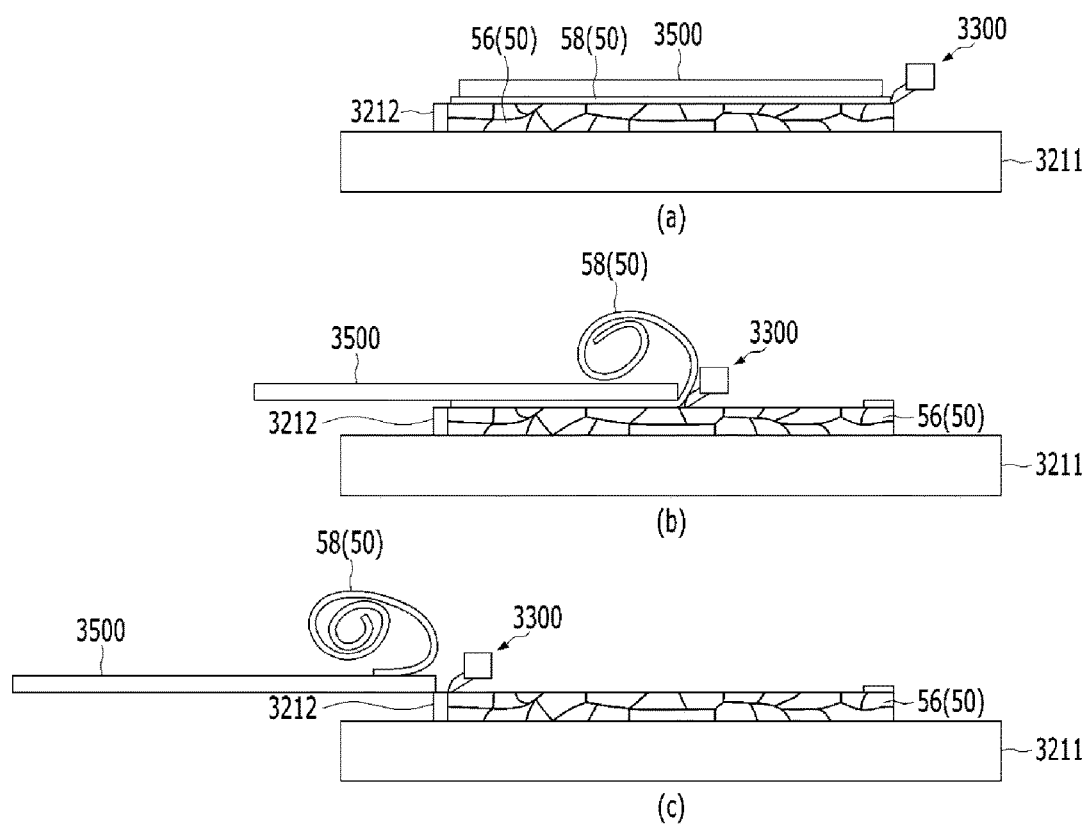

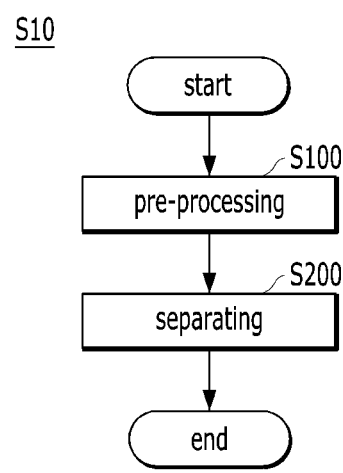
[FIG. 29]

[FIG. 30]
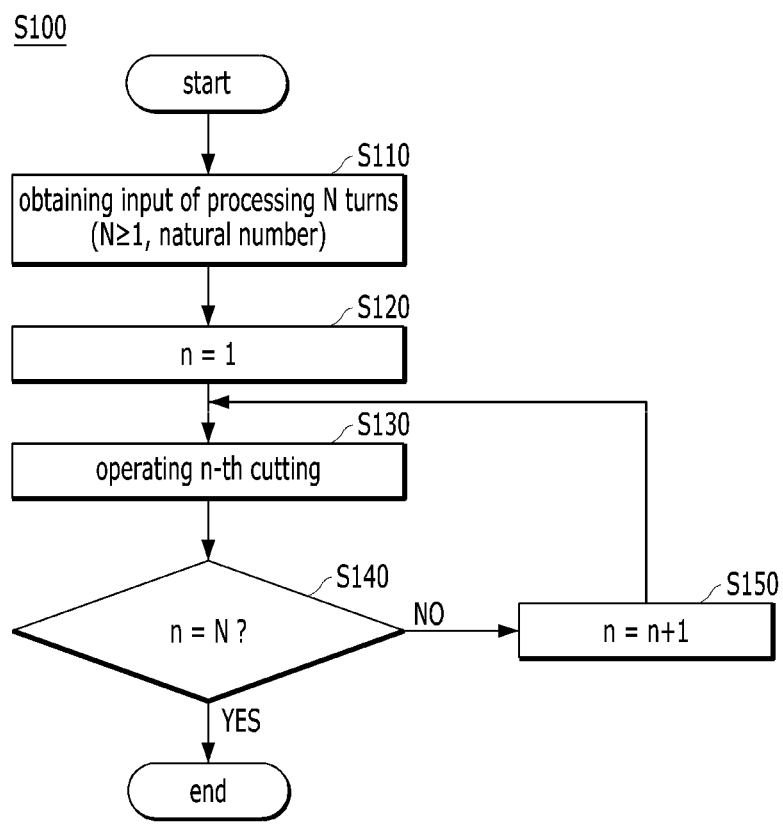

[FIG. 31]
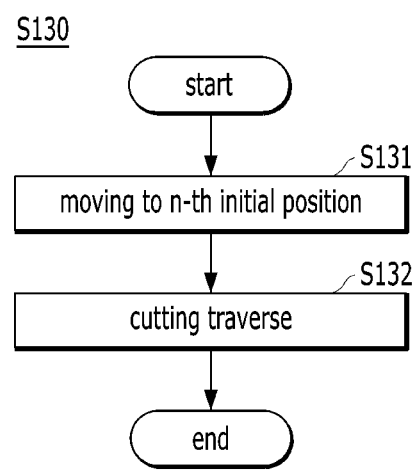

[FIG. 32]
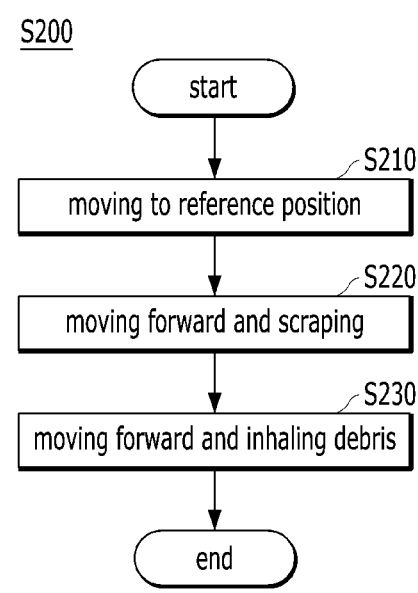

[FIG. 33]
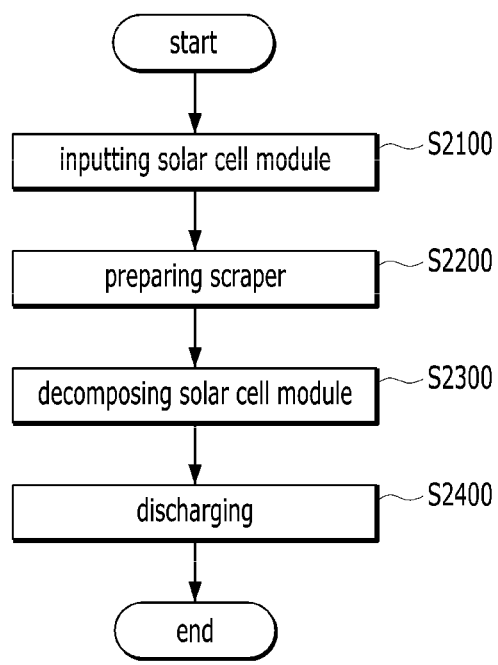

[FIG. 34]
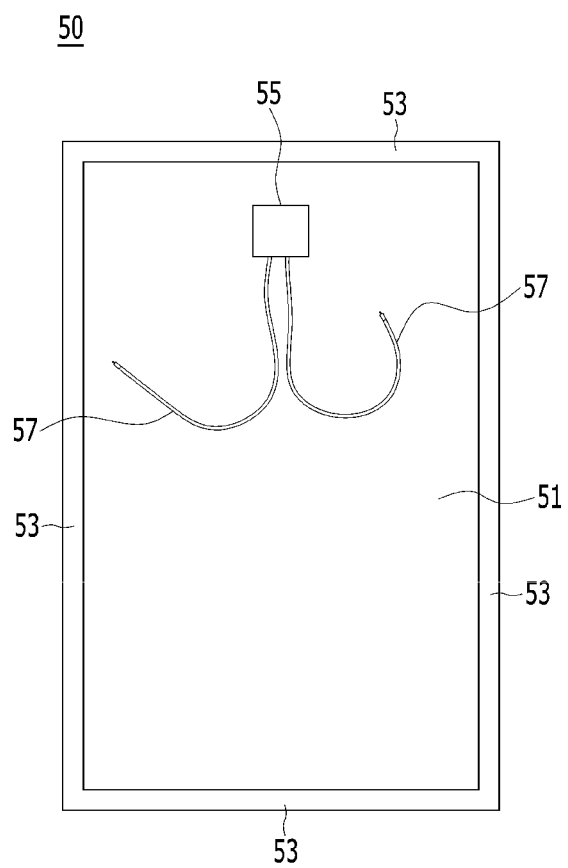

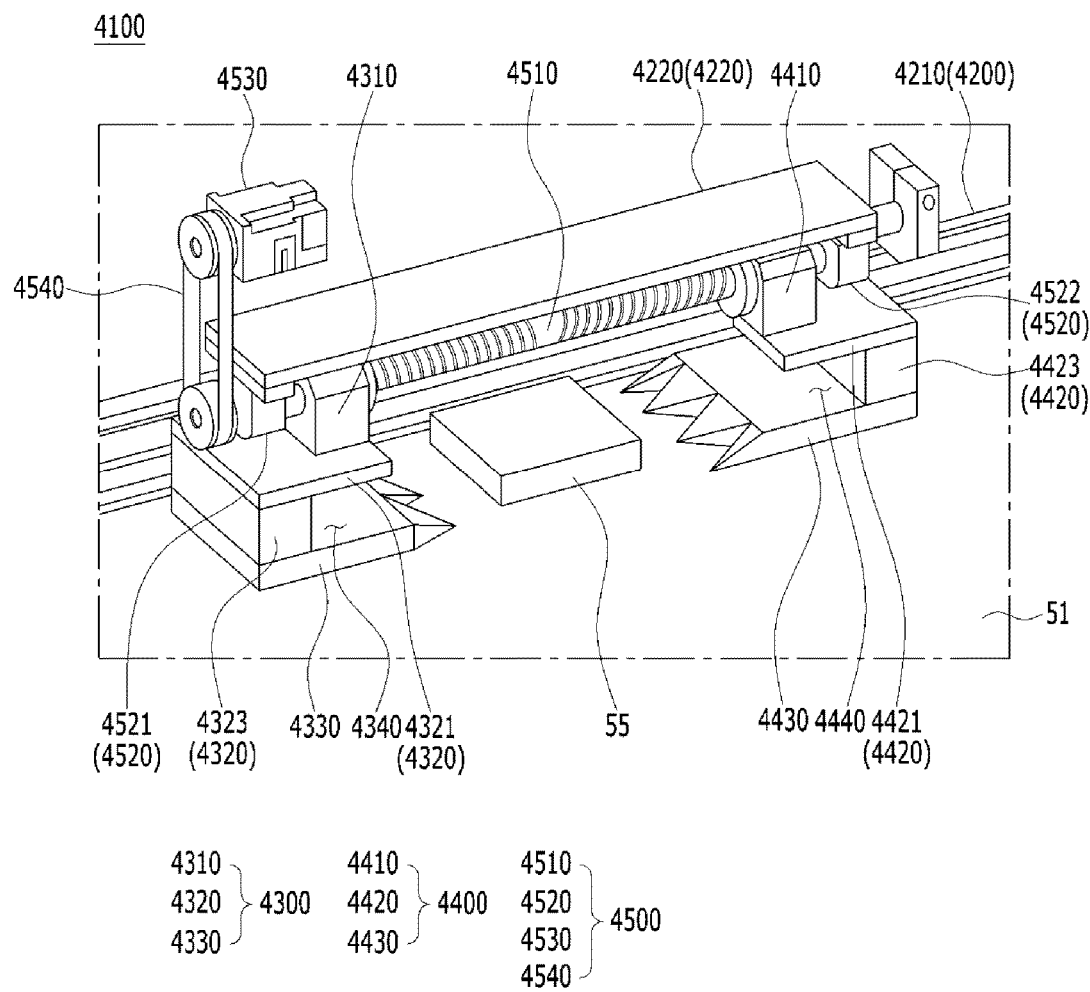
[FIG. 35]

[FIG. 36]
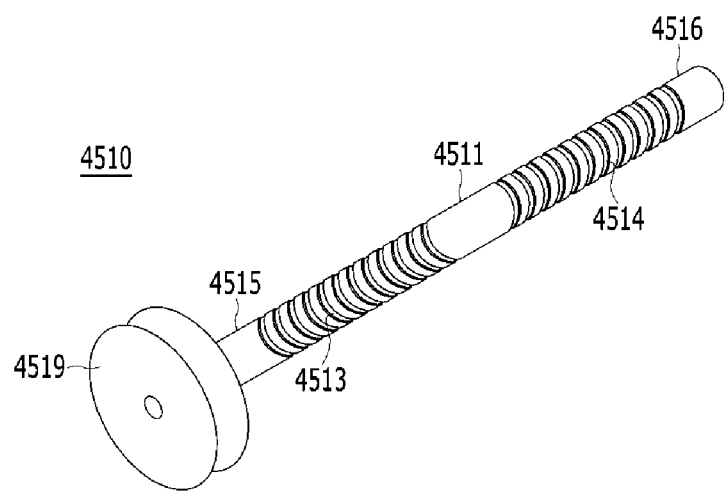

【FIG. 37】
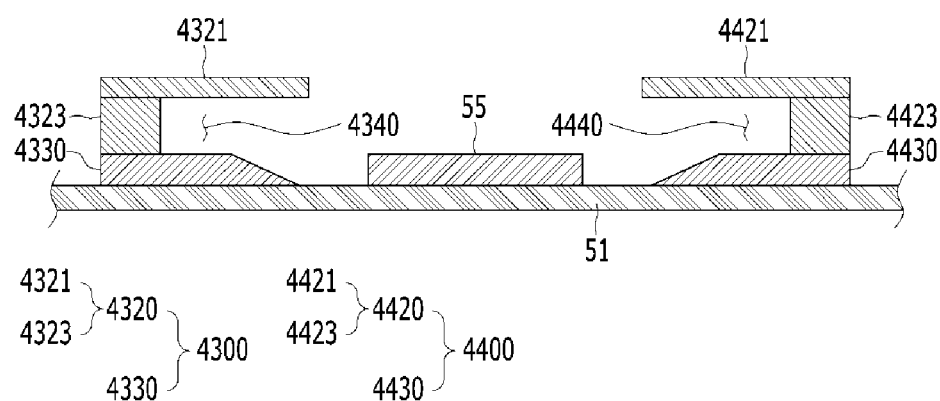

[FIG. 38]
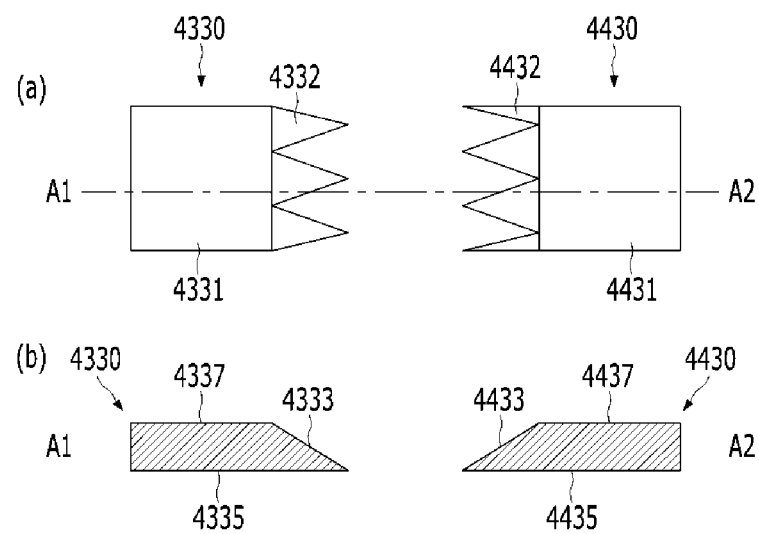

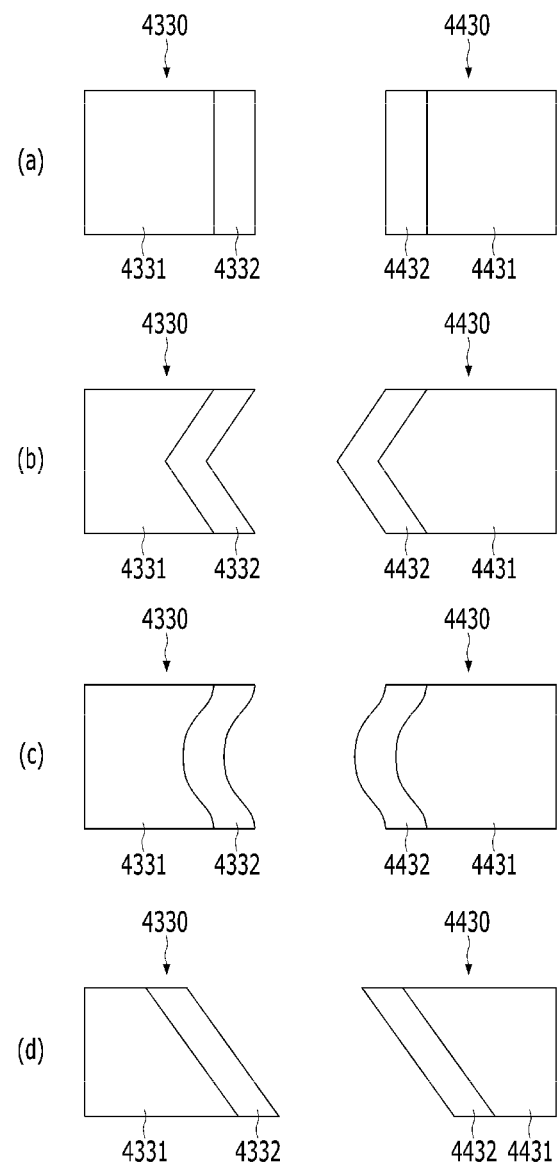
[FIG. 39]

[FIG. 40]
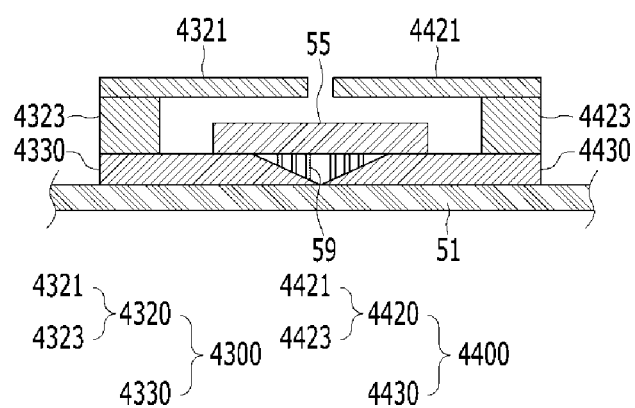

DEVICE AND METHOD FOR DISASSEMBLING SOLAR CELL MODULE

CROSS REFERENCE TO RELATED APPLICATIONS

This application claims the benefit of Korean Patent Application Nos. 10-2019-0013523 filed on Feb. 1, 2019, 10-2019-0074839 filed on Jun. 24, 2019, 10-2019-0080288 filed on Jul. 3, 2019 and 10-2019-0080289 filed on Jul. 3, 2019, the entire contents of which are incorporated herein by reference for all purposes as if fully set forth herein.

BACKGROUND OF THE INVENTION

Field of the Invention

The present invention is related to a disassembly device. In particular, the present invention is related to device and method for disassembling solar cell module effectively.

Discussion of the Related Art

A solar cell module may change the light energy of sunlight to the electrical energy. Solar cell modules are recognized as eco-friendly energy production methods. The solar cell modules that have reached the end of their life span may not be easy to be processed, because they are classified as industrial waste.

Meanwhile, the waste solar cell module includes glass and a valuable metal, so recycling of the waste solar cell module may be considered. Since the junction box attached to the solar panel includes the valuable metal, the recycling value may be relatively high. Accordingly, demands for technology for efficiently separating a junction box from a solar panel can be needed.

Especially, when the glass and the encapsulating material constituting the solar panel are separated, the separated glass may be easily recycled, and the separated encapsulating material may be extracted as a valuable metal and has high value of use. Accordingly, a demand for a technology for disassembling a solar panel among the solar cell modules may be needed.

SUMMARY OF THE INVENTION

Accordingly, an object of the present disclosure is to address the above-described and other problems.

The object of the present invention is to solve the above mentioned problems and other problems.

Another object of the present invention is to provide a solar cell module disassembling device which effectively disassembles the solar cell module.

Another object of the present invention is to provide a solar cell module disassembling device having a blade module which disassembles a solar cell module.

Another object of the present invention is to provide a solar cell module disassembling device having a blade forming assembly to maintain a posture of the blade module.

Another object of the present invention is to provide a solar cell module disassembling device which effectively separates an encapsulating material from a glass.

Another object of the present invention is to provide a solar cell module disassembling device which concentrates pressure on the boundary between the glass and the encapsulating material.

Another object of the present invention is to provide a solar cell module disassembling device having two blade unit for separating a junction box from a solar panel by approaching to and applying pressure to the junction box.

According to an aspect of the present invention, there is provided a solar cell module disassembling device comprising: a frame unit, wherein a laminated panel having a first panel and a second panel is mounted on the frame unit, and wherein the first and second panels are stacked and bonded; a guide module, being elongated in a forward and backward direction; a scraper unit, being movably coupled to the guide module, having a blade module, wherein the blade module moves in the forward and backward direction and presses the laminated panel and disassembles the laminated panel; and a transfer unit, being coupled to the scraper unit, delivering a driving force to the scraper unit, transferring the scraper unit.

According to another aspect of the present invention, there is provided a solar cell module disassembling method by using a solar cell module disassembling device, wherein the solar cell module disassembling device includes: the stage on which the solar cell module is mounted, wherein the solar cell module has the glass and the encapsulating material bonded on the glass; a scraper unit having the blade module, wherein the blade module disassembles the solar cell module; a sensor unit, measuring a thickness of the solar cell module and a position of the blade module; and a control unit being connected to the scraper unit and the sensor unit, characterized in that the solar cell module disassembling method comprises: putting a solar cell module onto a stage; moving a blade module to a reference position; moving the blade module and disassembling the solar cell module; and discharging a glass to an outside, wherein the glass is discharged by a solar cell module transfer roller installed in the stage when an encapsulating material is separated from the glass.

According to at least one of embodiments of present invention, the solar cell module disassembling device can effectively disassembles the solar cell module.

According to at least one of embodiments of present invention, the solar cell module disassembling device can have a blade module which disassembles a solar cell module.

According to at least one of embodiments of present invention, the solar cell module disassembling device can have a blade forming assembly to maintain a posture of the blade module.

According to at least one of embodiments of present invention, the solar cell module disassembling device can effectively separate an encapsulating material from a glass.

According to at least one of embodiments of present invention, the solar cell module disassembling device can concentrate pressure on the boundary between the glass and the encapsulating material.

According to at least one of embodiments of present invention, the solar cell module disassembling device can have two blade unit for separating a junction box from a solar panel by approaching to and applying pressure to the junction box.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 1 is a view illustrating a solar cell module disassembly device according to a first embodiment of the present invention.

FIG. 2 is a side view of the solar cell module disassembly device shown in FIG. 1.

FIG. 3 is a view illustrating that the solar cell module is put into the solar cell module disassembly device shown in FIG. 1.

FIGS. 4 to 8 are views illustrating a process of disassembling the solar cell module by the solar cell module disassembling device according to first embodiment of the present invention.

FIG. 9 is a view illustrating posture change of the blade module caused by rotation of the blade module.

FIG. 10 is a block diagram of the solar cell module disassembling device according to the first embodiment of the present invention.

FIGS. 11 to 23 are views illustrating the solar cell module disassembling device according to a second embodiment of the present invention.

FIGS. 24 and 25 are views illustrating the solar cell module disassembling device according to a third embodiment of the present invention.

FIG. 26 is a view illustrating a pre-processing module according to an embodiment of the present invention.

FIG. 27 is a view illustrating the solar cell module disassembling device including a press plate according to an embodiment of the present invention.

FIG. 28 is a flowchart illustrating operation of the press plate and scraper unit according to an embodiment of the present invention.

FIG. 29 is a flowchart illustrating a method for disassembling a solar cell module according to an embodiment of the present invention.

FIG. 30 is a view illustrating a pre-processing step according to an embodiment of the present invention.

FIG. 31 is a flowchart illustrating a n-th cutting step according to an embodiment of the present invention.

FIG. 32 is a flowchart illustrating a separating step according to an embodiment of the present invention.

FIG. 33 is a flowchart illustrating a method for disassembling a solar cell module according to another embodiment of the present invention.

FIG. 34 is a view illustrating a solar cell module.

FIGS. 35 to 40 are views illustrating a solar cell module disassembling device according to a fourth embodiment of the present invention.

DETAILED DESCRIPTION OF THE EMBODIMENTS

Reference will now be made in detail embodiments of the invention examples of which are illustrated in the accompanying drawings. Since the present invention may be modified in various ways and may have various forms, specific embodiments are illustrated in the drawings and are described in detail in the present specification. However, it should be understood that the present invention are not limited to specific disclosed embodiments, but include all modifications, equivalents and substitutes included within the spirit and technical scope of the present invention.

The terms 'first', 'second', etc. may be used to describe various components, but the components are not limited by such terms. The terms are used only for the purpose of distinguishing one component from other components. For example, a first component may be designated as a second component without departing from the scope of the present invention. In the same manner, the second component may be designated as the first component.

The term "and/or" encompasses both combinations of the plurality of related items disclosed and any item from among the plurality of related items disclosed.

When an arbitrary component is described as "being connected to" or "being linked to" another component, this should be understood to mean that still another component (s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present invention. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present invention pertains. The terms defined in a generally used dictionary must be understood to have meanings identical to those used in the context of a related art, and are not to be construed to have ideal or excessively formal meanings unless they are obviously specified in the present application.

The following exemplary embodiments of the present invention are provided to those skilled in the art in order to describe the present invention more completely. Accordingly, shapes and sizes of elements shown in the drawings may be exaggerated for clarity.

FIG. 1 is a figure showing a solar cell module disassembling device 100 according to a first embodiment of the invention.

Referring to FIG. 1, a top view of a solar cell module disassembling device 100 according to a first embodiment of the invention may be observed. The solar cell module disassembling device 100 may include a frame unit 200. In FIG. 1, a part of the frame unit 200 may be omitted for the convenience of description.

The frame unit 200 may include a table module 240 and a solar cell module transfer portion 250. The table module 240 may include a stage 241 on which the solar cell module is mounted. The solar cell module may be mounted in the stage 241. The solar cell module mounted in the stage 241 may be disassembled by the solar cell module disassembling device 100.

The solar cell module transfer portion 250 may be located on the stage 241. The solar cell module transfer portion 250 may be referred to as a solar cell module transfer roller. For example, a solar cell module transfer portion 250 may include a plurality of rollers. The solar cell module transfer portion 250 may be installed on the stage 241. When the solar cell module transfer portion 250 operates in a state in which the disassembling is completed, the remained solar cell module may be discharged to the outside.

The solar cell module transport portion 250 may be composed of a plurality of rollers. For example, a solar cell module transfer portion 250 may include a plurality of solar cell module transfer rollers 250. The multiple solar cell module transfer rollers 250 may be arranged in a longitudinal direction and/or a transverse direction of the guide module 310.

The multiple solar cell module transfer rollers 250 may be movably coupled to the stage 241. For example, multiple solar cell module transfer rollers 250 may rise and/or descend with respect to the stage 241. For example, when the decomposition of the solar cell module is in progress, the multiple solar cell module transfer rollers 250 may be located in the stage 241 and may not be in contact with the solar cell module. For example, when the decomposition of the solar cell module is completed, the multiple solar cell module transfer rollers 250 may rise and be in contact with the solar cell module, and then rotate to transfer the solar cell module.

The solar cell module disassembling device 100 may include a scraper unit 500. The scraper unit 500 may disassemble the solar cell module while adding pressure to the module.

The solar cell module disassembling device 100 may include a guide module 310. The guide module 310 may include a first guide part 310a and a second guide part 310b. The first guide part 310a may be referred to as a first rail. The second guide part 310b may be referred to as a second rail. The guide module 310 may be installed or coupled to the frame unit 200. The "drive unit" may be understood as a concept including a guide module 310. For example, the "drive unit" may provide a driving force to a scraper unit 500 coupled to the guide module 310.

The guide module 310 may form an elongated shape in a longitudinal direction. The first guide part 310a and the second guide part 310b may be positioned adjacent to both sides of the stage 241, for example. For example, the first guide part 310a may be adjacent to the left side of the stage 241. For example, the second guide part 310b may be adjacent to the right side of the stage 241. The first guide part 310a and the second guide part 310b may be in parallel with each other. The guide module 310 may guide the movement of the scraper unit 500.

The scraper unit 500 may include a first transverse beam 527. The first transverse beam 527 may be movably coupled to the guide module 310. For example, one end of the first transverse beam 527 may be movably coupled to the first guide part 310a. For example, the other end of the first transverse beam 527 may be movably coupled to the second guide part 310b. The moving direction of the first transverse beam 527 may be in parallel with the longitudinal direction of the guide module 310.

The first transverse beam 527 may be elongated in a longitudinal direction. For example, the first transverse beam 527 may form a shape extending from one end to the other end. The longitudinal direction of the first transverse beam 527 may be perpendicular to the longitudinal direction of the guide module 310.

The scraper unit 500 may include a blade module 540. The blade module 540 may be coupled to the first transverse beam 527. The blade module 540 may add the pressure to the solar cell module. The blade module 540 may move up and down with respect to the solar cell module. For example, the first transverse beam 527 coupled to the blade module 540 may move up and down with respect to the guide module 310.

The table module 240 may include a first support bar 245. The first support bar 245 may be located on the stage 241. The table module 240 may include a second support bar 246. The first support bar 245 may suppress the movement to the front of the solar cell module. The second support bar 246 may suppress the movement to the lateral part of the solar cell module. In other words, the first support bar 245 and the second support bar 246 may suppress the horizontal movement of the solar cell module. In FIG. 1, the front side may be in parallel with the direction in which the scraper unit 500 moves toward the first support bar 245. In other words, the forward direction in FIG. 1 may mean the direction in which the scraper unit 500 decomposes the solar cell module.

FIG. 2 is a figure showing the side view of the solar cell module disassembling device 100 shown in FIG. 1.

Referring to FIG. 2, the first support bar 245 may locate on the front side of the stage 241. The scraper unit 500 may locate in rear of the stage 241. The blade module 540 may be inclined with respect to the upper surface of the stage 241.

The solar cell module transfer unit 250 may be operated after completion of the dismantle work of the solar cell module. When the solar cell module transfer unit 250 is operated, the solar cell module may be moved backward and discharged.

FIG. 3 is a figure showing the solar cell module is put into the solar cell module disassembling device 100 shown in FIG. 1.

Referring to FIG. 3, the solar cell module 50 may be inserted into the solar cell module disassembling device 100 in the direction of the arrow shown in FIG. 3. When the solar cell module 50 is put into the solar cell module disassembling device 100, the solar cell module 50 may be placed on the stage 241. The first support bar 245 and the second support bar 246 may set the position of the solar cell module 50. For example, the position of the solar cell module 50 in the stage 241 may be determined by the first support bar 245 and the second support bar 246.

FIGS. 4 to 8 is figures showing a process in which a solar cell module disassembling device 100 according to a first embodiment of the invention disassembles a solar cell module 50.

Referring to FIG. 4, the scraper unit 500 may move in up and down direction or/and backward and forward direction to be positioned at a reference position. For example, the scraper unit 500 may be positioned at a reference position by moving in the arrow direction shown in FIG. 4. The reference position of the scraper unit 500 may be understood as a position for the scraper unit 500 to decompose the solar cell module 50. That is, the scraper unit 500 moves forward from a reference position to disassemble the solar cell module 50.

The solar cell module 50 may include glass 56 and an encapsulating material 58. The solar cell module 50 shown in FIG. 4 may be in a state where a junction box and a back sheet are removed. In another example, the solar cell module 50 may be in a state where the back sheet is not removed. In this case, the back sheet may be understood to be contained in the encapsulating material 58. When the scraper unit 500 is positioned at a reference position, the end of the blade module 540 may be positioned adjacent to the boundary between the glass 56 and the encapsulating material 58.

The solar cell module 50 may be disassembled and recycled. For example, glass or valuable metals included in the solar cell module 50 may be separated and recycled. The glass 56 may form a front surface of the solar cell module 50. And the glass 56 may transmit the light. The encapsulating material 58 may be located on the rear surface of the glass 56. The solar cell element may locate inside the encapsulating material 58. The encapsulating material 58 may protect the solar cell element. Or the encapsulating material 58 may couple the solar cell element to the glass 56. The solar cell element may convert the light energy into the electrical energy. In the encapsulating material 58, for example, a metal ribbon may be positioned.

Referring to FIG. 5, when the scraper unit 500 moves forward, the blade module 540 may separate the encapsulating material 58 from the glass 56.

The scraper unit 500 may include a press module 550. The press module 550 may be located on the front side of the blade module 540. The press module 550 may be located, for example, in front of the blade module 540, but may maintain the distance from the blade module 540 within a certain distance. For example, when the blade module 540 moves forward, the distance between the press module 550 and the blade module 540 may be maintained within a specific distance.

The press module 550 may include a roller. For example, the press module 550 may move forward while rolling when the blade module 540 moves forward. In this context, the press module 550 may be referred to as a press rod.

The press module 550 may be located in front of the scraper unit 500. The press module 550 located in front of the scraper unit 500 may be referred to as a first press rod. The press module 550 may be located behind the scraper unit 500. The press module 550 located behind the scraper unit 500 may be referred to as a second press rod. For example, a press module 550 may include at least one of a first press rod and a second press rod.

The press module 550 may provide pressure to, for example, the solar cell module 50. As the press module 550 provides pressure to the solar cell module 50, the blade module 540 may be easily located at the boundary between the glass 56 and the encapsulating material 58. That is, the press module 550 provides pressure to the solar cell module 50, so that the blade module 540 may easily separate the encapsulating material 58 from the glass 56.

Referring to FIG. 6, the scraper unit 500 may move further forward. In the process where the scraper unit 500 moves forward, the scraper unit 500 may provide a pressure to the front to the solar cell module 50. The first support bar 245 may suppress movement to the front of the solar cell module 50.

Referring to FIG. 7, the scraper unit 500 may move forward and be adjacent to the first support bar 245. In the process of separating the encapsulating material 58 from the glass 56, the encapsulating material 58 may be rolled forward. The encapsulating material 58 separated from the glass 56 may be recovered from the solar cell module disassembling device 100.

Referring to FIG. 8, the glass 56 may be discharged to the outside by a solar cell module transfer unit 250. For example, the solar cell module transfer unit 250 may be operated after the encapsulating material 58 (see FIG. 7) is separated from the glass 56 by the scraper unit 500. For example, after the encapsulating material 58 (see FIG. 7) is separated from the glass 56 by a scraper unit 500, the plurality of solar cell module transfer rollers 250 may rise and contact the glass 56. The plurality of solar cell module transfer rollers 250 may rotate. When the plurality of solar cell module transfer rollers 250 are rotated, the glass 56 may be transferred backward and discharged to the outside.

FIG. 9 is a figure showing the posture change of the blade module 540 caused by the rotation of the blade module 540.

Referring to FIG. 9, the blade module 540 may rotate with respect to the first transverse beam 527. The blade module 540, for example, may rotate in the direction of arrows shown in FIG. 9. According to rotation, the blade module 540 may face the front or rear. The angle formed by the blade module 540 and the stage 241 may be 5 to 175 degrees with respect to the front.

As the blade module 540 rotates in a first rotation direction, the blade module 540 may sequentially face the front downward, the lower, and the rear downward. As the blade module 540 rotates in a second rotation direction, the blade module 540 may sequentially face the rear downward, the lower and the front downward. The first rotation direction of the blade module 540 may be in the opposite rotation direction to the second rotation direction of the blade module 540.

The blade module 540 may move forward while being inclined forward with respect to the stage 241, and disassemble the solar cell module 50 (see FIG. 6). The angle formed by the blade module 540 and the stage 241 may be the same as the angle formed by the blade module 540 and the solar cell module 50 (see FIG. 6).

A process in which a blade module 540 disassembles from the middle part of the solar cell module 50 (see FIG. 6) may be considered. In other words, a process in which a reference position of the scraper unit 500 is located in the middle part of the solar cell module 50 (see FIG. 6) may be considered. In this case, after the blade module 540 moves forward from the front to disassemble a part of the solar cell module 50 (see FIG. 6), the blade module 540 rotates and moves backward from the rear to disassemble the remaining part of the solar cell module 50 (see FIG. 6).

FIG. 10 is a figure showing a block diagram of a solar cell module disassembling device 100 according to a first embodiment of the invention.

Referring to FIG. 10, the solar cell module disassembling device 100 according to the first embodiment of the invention may include a sensor unit 820. The sensor unit 820 may measure the thickness of the solar cell module 50 (see FIG. 6). For example, the sensor unit 820 may measure at least one of the total thickness of the solar cell module 50 (see FIG. 6), the thickness of the encapsulating material 58 (see FIG. 6), and the thickness of the glass 56 (see FIG. 6). The sensor unit 820 may generate a first signal S1 including the measured information.

The solar cell module disassembling device 100 may include a control unit 810. The control unit 810 may be referred to as "controller". The control unit 810 may receive a first signal S1 from the sensor unit 820. The first signal S1 may be referred as an input signal.

The control unit 810 may generate output signals S2, S3, S4 based on the first signal S1. The output signals S2, S3, S4 may mean at least one of a second signal S2, a third signal S3, and a fourth signal S4.

The solar cell module disassembling device 100 may include a transfer unit 400. The transfer unit 400 may be coupled to the scraper unit 500. The transfer unit 400 may move the scraper unit 500 in a forward and backward direction. That is, the transfer unit 400 may be coupled to the scraper unit 500 to provide a driving force. When the scraper unit 500 receives a driving force from the transfer unit 400, the scraper unit 500 may move from the guide module 310 (see FIG. 1). In another example, the transfer unit 400 may move the scraper unit 500 in a vertical direction. The output signals S2, S3, S4 may include information regarding the reference position of the blade module 540 (see FIG. 4). The transfer unit 400 may move the blade module 540 (see FIG. 4) to a reference position.

The output signals S2, S3, S4 may include information regarding the position or movement of the blade module 540 (see FIG. 4). In other words, according to the output signals S2, S3, S4 based on the first signal S1 including the thickness information of the solar cell module in the transfer process to the front of the blade module 540 (see FIG. 4), the blade module 540 (see FIG. 4) may effectively separate the encapsulating material 58 (see FIG. 6) from the glass 56 (see FIG. 6.)

The solar cell module transfer unit 250 may receive a fourth signal S4. The fourth signal S4 may include command information regarding the operation of the solar cell module transfer unit 250. The solar cell module transfer unit 250 may transfer the glass 56 (see FIG. 8) to the outside and discharge it according to the fourth signal S4.

The scraper unit 500 may include an ultrasonic module 580. The ultrasonic module 580 may be adjacent to the blade module 540 (see FIG. 6). The ultrasonic module 580 may provide ultrasonic waves to the solar cell module 50 (see FIG. 6). For example, the ultrasonic waves generated in the ultrasonic module 580 may be transmitted to the solar cell module 50 (see FIG. 6) via a blade module 540 (see FIG. 6) or/and a press module 550 (see FIG. 5). Thus, the solar cell module 50 (see FIG. 6) may be easily separated. The third signal S3 may include information regarding the operation of the ultrasonic module 580.

The scraper unit 500 may include a heating module 590. The heating module 590 may be adjacent to the blade module 540 (see FIG. 6). In another example, the heating module 590 may be adjacent to the ultrasonic module 580. The heating module 590 may provide heat to the solar cell module 50 (see FIG. 6). For example, the heat generated from the heating module 590 may increase the temperature of the blade module 50 (see FIG. 6) or/and the press module 550 (see FIG. 5). The heated blade module 50 (see FIG. 6) or/and the press module 550 (see FIG. 5) may, for example, transmit heat to the solar cell module 50 (see FIG. 6). Thus, the solar cell module 50 (see FIG. 6) may be easily separated. The third signal S3 may include information regarding the operation of the heating module 580.

Referring to FIGS. 1 to 10, the solar cell module disassembling device 100 according to the first embodiment of the invention is a device for disassembling the solar cell module 50, but is not limited to this. For example, a solar cell module disassembling device 100 may disassemble a "composite panel". The composite panel has a stacked structure and may mean a jointed panel. The composite panel may include, for example, a stacked first panel and a second panel.

That is, the solar cell module disassembling device 100 according to a first embodiment of the invention may separate a second panel attached to the first panel from the first panel. The first panel is, for example, a glass 56, and the second panel may be, for example, an encapsulating material 58. The strength of the first panel may be greater than the strength of the second panel.

FIG. 11 is a figure showing a solar cell module disassembling device 100 according to a second embodiment of the invention. FIG. 12 is a figure showing a view of a solar cell module disassembling device 100 shown in FIG. 11 from a different angle.

Referring to FIGS. 11 and 12, the solar cell module disassembling device 100 may include a frame unit 200. The frame unit 200 may provide a space on which a main component of the solar cell module disassembling device 100 is mounted. The frame unit 200 may provide a space on which the solar cell module 50 is mounted.

The frame unit 200 may include a lower frame module 210 and an upper frame module 220. The lower frame module 210 may include a wheel required for movement. The upper frame module 220 may be positioned on the upper part of the lower frame module 210. The upper frame module 220 may be supported by the lower frame module 210. The upper frame module 220 may provide the space in which the solar cell module 50 is mounted and disassembled. The lower frame module 210 may support the upper frame module 220. The frame unit 200 may include a table module 240. The table module 240 may include a plate on which the solar cell module 50 is mounted.

The solar cell module disassembling device 100 may include a drive unit 300. The drive unit 300 may generate a driving force of the solar cell module disassembling device 100. The drive unit 300 may include a motor 331. The motor 331 may generate a rotatory power. And the motor 331 may consume the electricity to provide the rotatory power. The motor 331 may be positioned in the lower frame module 210.

The drive unit 300 may include a first pulley 333. The first pulley 333 may be coupled to the motor 331. If the motor 331 revolves, the first pulley 333 may rotate. The drive unit 300 may include a second pulley 334 and a belt 335. The belt 335 may connect the first pulley 333 and the second pulley 334. For example, the belt 335 may form a shape surrounding the first pulley 333 and the second pulley 334. In other words, the first pulley 333 and the second pulley 334 may be located in the area formed by the belt 335.

If the motor 331 revolves, the first pulley 333 may rotate. When the first pulley 333 rotates, the belt 335 may transfer the rotary power to the second pulley 334. That is, when the first pulley 333 rotates, the second pulley 334 may rotate by the belt 335.

The driving force providing module 330 may mean at least one of a motor 331, a first pulley 333, a second pulley 334, and a belt 335. The motor 331 may mean at least one of an electric motor or a hydraulic motor. The first pulley 333 or/and the second pulley 334 may form the shape of the sawtooth.

The drive unit 300 may include a first drive coupling module 320. The first drive coupling module 320 may receive driving force from the driving force providing module 330. The first drive coupling module 320 may transfer the driving force to the transfer unit 400.

The drive unit 300 may include a guide module 310. The guide module 310 may guide the movement of the transfer unit 400. The guide module 310 may include a first guide part 310a and a second guide part 310b. The first guide part 310a and the second guide part 310b form an elongated shape in a moving direction of the transfer unit 400 and may be arranged in parallel with each other.

The first drive coupling module 320 may include a drive shaft 321. The drive shaft 321 is coupled to a second pulley 334 to receive rotatory force. For example, the rear end of the drive shaft 321 may be coupled to a second pulley 334. The drive shaft 321 may be rotatably supported by the drive housing 323. The drive housing 323 may be coupled, for example, to the front end of the drive shaft 321. The drive shaft 321 may be arranged between the first guide part 310a and the second guide part 310b.

The solar cell module disassembling device 100 may include a transfer unit 400. The transfer unit 400 is coupled to the drive unit 300 to receive a rotatory force. If the transfer unit 400 receives the driving force from the drive unit 300, the transfer unit 400 may move. If the transfer unit 400 receives the rotatory force from the drive unit 300, it may convert the rotatory force into translational movement.

The transfer unit 400 may include a transfer guide coupling part 430. The transfer guide coupling part 430 may be movably coupled to the guide module 310. The transfer guide coupling part 430 may move according to the longitudinal direction of the guide module 310. Accordingly, the moving direction of the transfer unit 400 may be parallel with the longitudinal direction of the guide module 310.

The solar cell module disassembling device 100 may include a scraper unit 500. The scraper unit 500 may be coupled to the transfer unit 400. Therefore, when the transfer unit 400 moves, the scraper unit 500 may move. The scraper unit 500 may include the blade. The blade included in the scraper unit 500 may separate the encapsulating material 58 (see FIG. 4) from glass 56 (see FIG. 4) when the scraper unit 500 moves forward.

The solar cell module disassembling device 100 may include an auxiliary roller unit 600. The auxiliary roller unit 600 may include an auxiliary roller guide 610. The auxiliary roller guide 610 may be installed in the upper frame module 220. The auxiliary roller guide 610 may be provided in multiple. The longitudinal direction of the auxiliary roller guide 610 may be in parallel with the longitudinal direction of the guide module 310.

The auxiliary roller unit 600 may include an auxiliary roller module 620. The auxiliary roller module 620 may be movably coupled to the auxiliary roller guide 610. The auxiliary roller module 620 is positioned on the solar cell module 50 and may provide pressure to the solar cell module 50. For example, the auxiliary roller module 620 may suppress the hearing of the solar cell module 50 by providing pressure to the solar cell module 50. The blade included in the scraper unit 500 by an auxiliary roller module 620 may be easily located at the boundary between the encapsulating material 58 (see FIG. 4) and the glass 56 (see FIG. 4). The auxiliary roller module 620 may be an embodiment of a press module 550 (see FIG. 5).

The auxiliary roller module 620 may move in accordance with the movement of the scraper unit 500. For example, the auxiliary roller module 620 may be positioned in front of the scraper unit 500 when the scraper unit 500 moves forward, and may maintain a distance from the scraper unit 500 within a certain distance.

The auxiliary roller module 620 provides pressure to the solar cell module 50, thereby fixing glass 56 (see FIG. 4) to the table module 240. As a result, the pressure provided by the scraper unit 500 to the solar cell module 50 may be concentrated at a point where the scraper unit 500 is in contact with the solar cell module 50. Therefore, due to the auxiliary roller module 620, the decomposition of the solar cell module 50 may be facilitated.

The auxiliary roller module 620 may include, for example, a roller. The roller equipped in the auxiliary roller module 620 may provide the pressure to the solar cell module 50 while rolling in the solar cell module 50.

For example, the auxiliary roller module 620 may include a plate, although not shown in the figure. The plate of the auxiliary roller module 620 may be particularly effective when the glass 56 (see FIG. 4) breaks down the damaged solar cell module 50. The plate of the auxiliary roller module 620 may be referred as an auxiliary press plate. The auxiliary roller module 620 with a plate may be referred as an auxiliary press plate module.

In the process of decomposing the solar cell module 50 by moving the scraper unit 500 while applying pressure to the solar cell module 50, the solar cell module 50 may suppress the movement of the scraper unit 500. When the power in which the solar cell module 50 suppresses movement of the scraper unit 500 is constant, the scraper unit 500 moves while applying a constant pressure to the solar cell module 50 to disassemble the module 50.

When the power in which the solar cell module 50 suppresses movement of the scraper unit 500 is not constant, the scraper unit 500 may be difficult to move while applying constant pressure to the solar cell module 50. In other words, if the power of suppressing movement of the scraper unit 500 is not constant, the relative attitude of the scraper unit 500 to the solar cell module 50 may be deformed. When the posture of the scraper unit 500 is deformed, the decomposition of the solar cell module 50 by the scraper unit 500 may not be easy. For example, if the posture of the scraper unit 500 is deformed, a part of the encapsulating material 58 (see FIG. 4) may remain in the glass 56 (see FIG. 4) or the glass 56 (see FIG. 4) may be damaged by the scraper unit 500.

The scraper unit 500 may be located on the edge of the encapsulating material 58 (see FIG. 4). The scraper unit 500 may apply pressure to the encapsulating material 58 (see FIG. 4). The scraper unit 500 may move in one direction. When the scraper unit 500 moves with pressure between the encapsulating material 58 (see FIG. 4) and the glass 56 (see FIG. 4), the encapsulating material 58 (see FIG. 4) may be separated from the glass 56 (see FIG. 4).

Components may locate in the encapsulating material 58 (see FIG. 4). The components located in the encapsulating material 58 (see FIG. 4) may be, for example, a solar cell element or/and a metal ribbon. In the process of decomposing the solar cell module 50 by the scraper unit 500, the component located in the encapsulating material 58 (see FIG. 4) may suppress the movement of the scraper unit 500. When movement of the scraper unit 500 is suppressed, pressure may be applied to the scraper unit 500. When pressure is applied to the scraper unit 500, the attitude of the scraper unit 500 may be twisted. If the posture of the scraper unit 500 is twisted, the size or/and direction of the pressure provided by the scraper unit 500 to the solar cell module 50 may not be constant. And if the size or/and direction of the pressure provided by the scraper unit 500 to the solar cell module 50 is not constant, the encapsulating material 58 may remain in the glass 56 (see FIG. 4) or the glass 56 (see FIG. 4) may be damaged by the scraper unit 500. In this case, the recycling value of the solar cell module 50 may be relatively lowered. Therefore, the posture of the scraper unit 500 may need to be kept constant.

When the scraper unit 500 moves with a pressure provided to the solar cell module 50, the scraper unit 500 may separate the encapsulating material 58 (see FIG. 4) from the glass 56 (see FIG. 4). The separated encapsulating material 58 (see FIG. 4) may be separated from glass 56 (see FIG. 4) while being curled in the moving direction of the scraper unit 500.

The solar cell module disassembling device 100 may include an anti-tilting unit 700. The anti-tilting unit 700 may be coupled to the scraper unit 500 so that the posture of the scraper unit 500 may be maintained constant.

The anti-tilting unit 700 may include a front anti-tilting module 710 and a rear anti-tilting module 720. The front anti-tilting module 710 and the rear anti-tilting module 720 may be movably coupled to the guide module 310. The anti-tilting unit 700 may include a connection bar 730. The connection bar 730 may be coupled to the front anti-tilting module 710 and the rear anti-tilting module 720. For example, a front end of the connection bar 730 may be coupled to a front anti-tilting module 710. For example, the rear end of the connection bar 730 may be coupled to a rear anti-tilting module 720. The connection bar 730 may be coupled to the scraper unit 500. The connection bar 730 may include a first connection bar 730a and a second connection bar 730b. The first connection bar 730a may connect the first front filler 713a and the first rear filler 723a. The second connection bar 730b may connect the second front filler 713b and the second rear filler 723b.

When the scraper unit 500 moves, the front anti-tilting module 710 and the rear anti-tilting module 720 may move by the connection bar 730. The forward movement of the scraper unit 500 may be considered. The front anti-tilting module 710 may suppress the pitch angle of the scraper unit 500 from being changed to negative. The rear anti-tilting module 720 may suppress the pitch angle of the scraper unit 500 from being changed to positive.

"The pitch angle of the scraper unit 500 is changed to negative" may mean that the front end portion of the scraper unit 500 is directed downward. "The pitch angle of the scraper unit 500 is changed to positive" may mean that the front end portion of the scraper unit 500 is directed upward. The front side of the solar cell module disassembling device 100 may mean a direction from the rear end of the guide module 310 to the front end.

The solar cell module disassembling device 100 may include a control unit 810. The control unit 810 may obtain an input from a user. The control unit 810 may control the drive unit 300. For example, the control unit 810 may control the motor 331. And the control unit 810 may control the motor 331 to move the scraper unit 500.

FIG. 13 is a figure that is displayed except for some configuration of the solar cell module disassembling device 100 shown in FIG. 11. FIG. 14 is a figure showing a view of a solar cell module disassembling device 100 shown in FIG. 13 from a different angle.

Referring to FIGS. 13 and 14, the frame unit 200 may include a platform module 230. The platform module 230 may be located at the boundary between the lower frame module 210 (see FIG. 2) and the upper frame 220 (see FIG. 2). The guide module 310, the drive housing 323, and the table module 240 may be mounted on the platform module 230. The solar cell module 50 may be positioned on the table module 240. The table module 240 may be positioned between the first guide part 310a and the second guide part 310b.

The drive shaft 321 is coupled to the drive housing 323 to rotate. The drive shaft 321 may be positioned under the table module 240. The drive shaft 321 may be positioned between the first guide part 310a and the second guide part 310b.

The front end of the drive shaft 321 may be coupled to the first drive housing 323a. The front end of the drive shaft 321 is coupled to the second pulley 334 to receive the rotatory force. The first drive housing 323a may be located in rear of the second pulley 334.

The transfer unit 400 may include a second drive coupling part 420. The second drive coupling part 420 may be coupled to the drive shaft 321. The second drive coupling part 420 may convert the rotatory force delivered from the drive shaft 321 into translational movement. The second drive coupling part 420 may move in a longitudinal direction of the drive shaft 321. The second drive coupling part 420 may form the hollow portion opened to the forward and backward. The drive shaft 321 may be inserted into the second drive coupling part 420. Thread may be formed in the hollow portion of the second drive coupling part 420. The thread may be formed on the exterior of the drive shaft 321. The thread formed on the second drive coupling part 420 may be coupled to thread formed on the drive shaft 321.

In another example, a second drive coupling part 420 may be provided with translational movement from the drive unit 300. For example, the drive unit 300 may provide a driving force to the second drive coupling part 420 in a hydraulic manner. In this case, the drive unit 300 may include a hydraulic drive module. The hydraulic drive module may be coupled to the frame unit 200 and the second drive coupling part 420 and it may move the second drive coupling part 420 by using the hydraulic pressure.

The transfer unit 400 may include a transfer guide coupling part 430. The transfer guide coupling part 430 may be movably coupled to the guide module 310. For example, the first transfer guide coupling part 430a may be movably coupled to the first guide part 310a. For example, the second transfer guide coupling part 430b may be movably coupled to the second guide part 310b. The movement of the transfer guide coupling part 430 may be limited by the guide module 310. For example, the movement of the transfer guide coupling part 430 may be limited in the longitudinal direction of the guide module 310.

The transfer unit 400 may include a transfer body 410. The transfer body 410 may be connected from a first transfer guide coupling part 430a to a second transfer guide coupling part 430b. For example, a first end of the transfer body 410 may be coupled to the first transfer guide coupling part 430a. For example, a second end of the transfer body 410 may be coupled to the second transfer guide coupling part 430b. The transfer body 410 may be connected from a first end to a second end. The transfer body 410 may be coupled to the second drive coupling part 420. For example, a second drive coupling part 420 may be coupled to the center of the transfer body 410.

The scraper unit 500 may be coupled to the transfer unit 400. For example, the scraper unit 500 may be mounted on a transfer guide coupling part 430. When the transfer unit 400 moves, the scraper unit 500 may move in a forward and backward direction along the transfer unit 400.

The scraper unit 500 may include a transfer guide support module 510. The transfer guide support module 510 may be coupled to the transfer guide coupling part 430. The transfer guide support module 510 has a shape which is extended upward from the transfer guide coupling part 430. For example, the transfer guide support module 510 may be extended upward and rearward from the transfer guide coupling part 430.

The transfer guide support module 510 may include a first transfer guide support portion 510a and a second transfer guide support portion 510b. The first transfer guide support portion 510a may be coupled to the first transfer guide coupling part 430a. The second transfer guide support portion 510b may be coupled to the second transfer coupling part 430b.

The scraper unit 500 may include a height adjustment module 520. The height adjustment module 520 may be coupled to the transfer guide support module 510. For example, a first height adjustment module 520a may be coupled to a first transfer guide support portion 510a. For example, a second height adjustment module 520b may be coupled to a second transfer guide support portion 510b.

The height adjustment module 520 may include a height adjustment housing 521 and a height adjustment bar 523. The height adjustment housing 521 may be coupled to the transfer guide support module 510. The height adjustment housing 521 may be coupled to an upper portion of the transfer guide support module 510. For example, a first height adjustment housing 521a may be coupled to a first transfer guide support portion 510a. For example, a second height adjustment housing 521b may be coupled to a second transfer guide support portion 510b.

The height adjustment bar 523 may be coupled to the height adjustment housing 521. The height adjustment bar 523 may form a shape elongated from the height adjustment housing 521 to the upper part. The vertical length of the height adjustment bar 523 may be adjusted. For example, the vertical length of the height adjustment bar 523 may be adjusted by operation in the height adjustment housing 521. The lower portion of the height adjustment bar 523 may be positioned below the transfer guide support module 510 through the transfer guide support module 510. As the vertical height of the height adjustment bar 523 is adjusted, the solar cell module 50 having various heights can be disassembled.

The height adjustment module 520 may include a height adjustment knob 525. The height adjustment knob 525 may be coupled to the height adjustment housing 521. The height adjustment knob 525 may control the vertical length of the height adjustment bar 523 by causing the operation of the height adjustment housing 521. The vertical length of the height adjustment bar 523 may be set based on the upper surface of the height adjustment housing 521.

The scraper unit 500 may include a connecting beam 530. The connecting beam 530 may be coupled to the height adjustment module 520. The connecting beam 530 may be elongated from the first height adjustment module 520a to form a shape leading to the second height adjustment module 520b. For example, a first end of the connecting beam 530 is coupled to the first height adjustment module 520a, and a second end of the connecting beam 530 is coupled to the second height adjustment module 520b.

The scraper unit 500 may include a blade module 540. The blade module 540 may be coupled to a connecting beam 530 or/and a height adjustment module 520. For example, the blade module 540 may be coupled to the connecting beam 530. The blade module 540 may be positioned on the upper part of the table module 240. For example, at least a portion of the blade module 540 may be located on the upper part of the solar cell module 50 loaded on the table module 240. At least a part of the blade module 540 may decompose the solar cell module 50 by applying pressure to the module 50.

The anti-tilting unit 700 may be coupled to the scraper unit 500. For example, the anti-tilting 700 may be coupled to the connecting beam 530. The anti-tilting unit 700 may be elongated from the connecting beam 530 to form a shape leading to the guide module 310. For example, the upper portion of the anti-tilting unit 700 may be coupled to the connecting beam 530, and the lower portion of the anti-tilting unit 700 may be movably coupled to the guide module 310.

The anti-tilting unit 700 may include a front anti-tilting module 710 and a rear anti-tilting module 720. The front anti-tilting module 710 may be positioned in front of the scraper unit 500. The rear anti-tilting module 720 may be positioned behind the scraper unit 500. The front anti-tilting module 710 and the rear anti-tilting module 720 may be connected to the scraper unit 500. For example, the front anti-tilting module 710 and the rear anti-tilting module 720 may be connected to the scraper unit 500 by a connecting bar 730.

The pressure or force applied to the scraper unit 500 may be delivered to the front anti-tilting module 710 or/and the rear anti-tilting module 720 via a connecting bar 730. Here, the pressure or force applied to the scraper unit 500 may include a pressure or force applied to the scraper unit 500 by the solar cell module 50. The pressure or force applied by the solar cell module 50 to the scraper unit 500 may be applied to modify the posture of the scraper unit 500. The anti-tilting unit 700 may disperse pressure or force applied to the scraper unit 500 into the front anti-tilting module 710 or/and the rear anti-tilting module 720. Therefore, the anti-tilting unit 700 may maintain the posture of the scraper unit 500.

The front anti-tilting module 710 may include a front guide coupling part 711 and a front side pillar 713. The front guide coupling part 711 may be movably coupled to the guide module 310. For example, a first front guide coupling part 711a may be coupled to a first guide part 310a. For example, a second front guide coupling part 711b may be coupled to a second guide part 310b. The front guide coupling part 711 may be positioned in front of the transfer guide coupling part 430. For example, a first front guide coupling part 711a may be located in front of a first transfer guide coupling part 430a, and a second front guide coupling part 711b may be located in front of a second transfer guide coupling part 430b.

The front side filler 713 may be elongated to the upper part from the front guide coupling part 711 to form a shape leading to the connecting bar 730. For example, the lower portion of the first front side filler 713a may be coupled to the first front guide coupling part 711a, and the upper portion of the first front side filler 713b may be coupled to the connecting bar 730. For example, the lower portion of the second front side filler 713b may be coupled to the second front guide coupling part 711b, and the upper portion of the second front side filler 713b may be coupled to the connecting bar 730.

The rear anti-tilting module 720 may include a rear guide coupling part 721 and a rear side pillar 723. The rear guide coupling part 721 may be movably coupled to the guide module 310. For example, a first rear guide coupling part 721a may be coupled to a first guide part 310a. For example, a second rear guide coupling part 721b may be coupled to a second guide part 310b. The rear guide coupling part 721 may be positioned behind the transfer guide coupling part 430. For example, a first rear guide coupling part 721a may be located behind a first transfer guide coupling part 430a, and a second rear guide coupling part 721b may be located behind a second transfer guide coupling part 430b.

The rear side filler 723 may be extended upward from the rear guide coupling part 721 and may form a shape leading to the connecting bar 730. For example, the lower portion of the first rear side filler 723a may be coupled to the first rear guide coupling part 721a, and the upper portion of the first rear side filler 723b may be coupled to the connecting bar 730. For example, the lower portion of the second rear side filler 723b may be coupled to the second rear guide coupling part 721b, and the upper portion of the second rear side filler 723b may be coupled to the connecting bar 730.

FIG. 15 is a figure showing a transfer unit and a scraper unit according to a second embodiment of the invention. In FIG. 15, for the convenience of description, some configurations of the scraper unit 500 may not be displayed.

Referring to FIG. 15, the transfer unit 400 may include a transfer body 410, a second drive coupling part 420, and a transfer guide coupling part 430. The second drive coupling part 420 may have a hollow portion therein. The drive unit 300 (see FIG. 11) may be coupled to the second drive coupling part 420. For example, a drive shaft 321 (see FIG. 14) may be fitted and coupled to a second drive coupling part 420. The second drive coupling part 420 may receive a driving force from the drive unit 300 (see FIG. 11). The second drive coupling part 420 may convert, for example, the provided rotatory force into translational movement.

The transfer body 410 may be coupled to the second drive coupling part 420. The transfer body 410 may receive power related to translational movement from a second drive coupling part 420. The first end of the transfer body 410 may be coupled to the first transfer guide coupling part 430a, and the second end of the transfer body 410 may be coupled to the second transfer guide coupling part 430b. The movement of the transfer body 410 may be limited by the transfer guide coupling part 430. For example, the movement of the transfer body 410 may be limited to a movement path of the transfer guide coupling part 430. The movement path of the transfer guide coupling part 430 may be set by a guide module 310 (see FIG. 14). For example, the transfer guide coupling part 430 may move along the guide module 310 (see FIG. 14).

The scraper unit 500 may be mounted on the transfer unit 400. The first transfer guide support portion 510a may be coupled to, for example, a first transfer guide coupling part 430a. The second transfer guide support portion 510b may be coupled, for example, to a second transfer guide coupling part 430b. The movement of the scraper unit 500 may be implemented by the transfer unit 400.

The scraper unit 500 may include a first transverse beam 527. The first transverse beam 527 may connect a first height adjustment housing 521a task and a second height adjustment housing 521b. The first transverse beam 527 may synchronize the setting of the first height adjustment housing 521a and the setting of the second height adjustment housing 521b. Accordingly, the vertical length of the first height adjustment bar 523a may be substantially the same as the vertical length of the second height adjustment bar 523b.

FIG. 16 is a figure showing an addition of a blade module 540 and a press module 550 to a scraper unit 500 shown in FIG. 15.

Referring to FIG. 16, the scraper unit 500 may include a blade module 540. The blade module 540 may be coupled to the connecting beam 530. The blade module 540 may be positioned on the upper part of the table module 240. The blade module 540 may decompose the solar cell module 50 (see FIG. 14) by applying pressure to the module 50 (see FIG. 14).

The scraper unit 500 may include a press module 550. The press module 550 may be coupled to the connecting beam 530. The press module 550 may provide pressure in a direction from the top to the bottom of the solar cell module 50 (see FIG. 14). And the press module 550 may provide pressure to the solar cell module 50 (see FIG. 14) to facilitate the operation of the blade module 540. For example, the press module 550 may apply pressure to the solar cell module 50 (see FIG. 9) of an area adjacent to the action point of the blade module 540 and the solar cell module 50 (see FIG. 9). Therefore, the blade module 540 may be easily positioned at the boundary between glass 56 (see FIG. 4) and encapsulating material 58 (see FIG. 4).

FIG. 17 is a figure showing an addition of an anti-tilting unit 700 to a solar cell module disassembling device 100 shown in FIG. 16.

Referring to FIG. 17, the anti-tilting unit 700 may be coupled to a connecting beam 530. The first connecting bar 730a and the second connecting bar 730b may be coupled to the connecting beam 530. The first connecting bar 730a may be adjacent to the first height adjustment module 520a (see FIG. 14). The second connecting bar 730b may be adjacent to the second height adjustment module 520b (see FIG. 14).

The connecting bar 730 may include a bar hereinafter, a lower side connecting bar which is not shown in the Figure but connects the front guide coupling part 711 (see FIGS. 4 and 5) and the rear guide coupling part 721 (see FIGS. 13 and 14). The lower side connecting bar may connect the front guide coupling part 711 (see FIGS. 4 and 5) and the transfer guide coupling part 430 (see FIG. 15). The lower side connecting bar may connect the rear guide coupling part 721 (see FIGS. 13 and 14) and the transfer guide coupling part 430 (see FIG. 15). Therefore, the lower side connecting bar may directly transfer the driving force of the transfer guide coupling part 430 (see FIG. 15) to the anti-tilting unit 700. The lower side connecting bar may maintain the interval between the front guide coupling part 711 (see FIGS. 13 and 14) and the transfer guide coupling part 430 (see FIG. 15). The lower side connecting bar may maintain the interval between the rear guide coupling part 721 (see FIGS. 13 and 14) and the transfer guide coupling part 430 (see FIG. 15). Therefore, the anti-tilting unit 700 may maintain the posture of the scraper unit 500 (see FIGS. 13 and 14) more effectively and constantly.

FIGS. 18 and 19 are cross-sectional perspective views that cut the solar cell module disassembling device 100 shown in FIG. 14 in the longitudinal direction. The longitudinal direction of the solar cell module disassembling device 100 may be in parallel with the forward and backward direction of the solar cell module disassembling device 100. The transverse direction of the solar cell module disassembling device 100 may be perpendicular to the longitudinal direction of the solar cell module disassembling device 100. The transverse direction and the longitudinal direction of the solar cell module disassembling device 100 may form a horizontal surface of the solar cell module disassembling device 100.

Referring to FIG. 18, a cross section of the drive shaft 321 may be observed. The drive shaft 321 may be rotatably coupled to a first drive housing 323a and a second drive housing 323b. The drive shaft 321 is coupled to a second pulley 334 to receive rotatory force.

The second drive coupling part 420 may be rotatably coupled to the drive shaft 321. For example, the drive shaft 321 may penetrate the hollow portion of the second drive coupling part 420. The drive shaft 321 may provide a rotatory force to the second drive coupling part 420. The second drive coupling part 420 may convert the rotatory power delivered from the drive shaft 321 into translational force. The translational force may be a force that causes translational movement.

The press module 550 may include a press roller 557. The press roller 557 may be a cylindrical shape. The press roller 557 may press the solar cell module 50. The press roller 557 may move while rolling on the solar cell module 50 according to movement of the transfer unit 400. The press roller 557 may be located in front of the blade module 540. And the press roller 557 may be located behind the auxiliary roller module 620 (see FIG. 3).

Referring to FIG. 19, a cross section of the guide module 310 may be observed. The transfer guide coupling part 430, the front guide coupling part 711, and the rear guide coupling part 721 may be movably coupled to the guide module 310. The rear guide coupling part 721 may form a shape surrounding a part of the guide module 310.

Referring to FIGS. 18 and 19, the guide module 310 and the drive housing 323 may be mounted on the platform module 230.

The drive shaft 321, the second drive coupling part 420 and transfer body 410 may be positioned at the lower part of the solar cell module 50. The translational force formed on the second drive coupling part 420 may be delivered to the transfer guide coupling part 430 through the transfer body 410. When the transfer guide coupling part 430 moves along with the guide module 310, the scraper unit 500 and the anti-tilting unit 700 may move with the transfer guide coupling part 430.

In the process of moving the scraper unit 500, the press roller 557 provides pressure to the solar cell module 50 while rolling on the module 50 and the blade module 540 may decompose the solar cell module 50. And in the process of moving the scraper unit 500, the anti-tilting unit 700 may maintain the posture of the scraper unit 500.

FIG. 20 is a figure showing a blade module 540 according to a second embodiment of the invention. FIG. 21 is a cross-sectional perspective view that cut the blade module shown in FIG. 20 in the longitudinal direction.

Referring to FIGS. 20 and 21, the blade module 540 may include a blade beam 543. The blade beam 543 may be coupled to the connecting beam 530 (see FIG. 18). The blade module 540 may include a blade bracket, although not shown in FIG. 20. And the blade bracket may connect the blade beam 543 and the connecting beam 530 (see FIG. 18).

The blade module 540 may include a first blade body 545 and a second blade body 547. The first blade body 545 may be coupled to the blade beam 543. The second blade body 547 may be coupled to the first blade body 545. For example, the second blade body 547 may be coupled to the first blade body 545 by screwing. That is, the second blade body 547 coupled to the first blade body 545 may be separated from the first blade body 545.

The blade module 540 may include a blade cutting portion 549. The blade cutting portion 549 may be composed of the metal or alloy material. The blade cutting portion 549 may provide pressure to the solar cell module 50 (see FIG. 18). The blade cutting portion 549 may be positioned between a first blade body 545 and a second blade body 547. The blade cutting portion 549 may be coupled to the first blade body 545 or/and the second blade body 547, for example by a bolt.

When the first blade body 545 and the second blade body 547 are separated, the blade cutting portion 549 may be separated from the blade body 545, 547. Therefore, the blade cutting portion 549 may be easily replaced. The blade body 545, 547 may mean at least one of the first blade body 545 and the second blade body 547.

FIG. 22 is a figure showing a press module 550 according to a second embodiment of the invention.

Referring to FIG. 22, the press module 550 may include a press bracket 551. The press bracket 551 may be coupled to the connecting beam 530 (see FIG. 18). And the press bracket 551 may include a first press bracket 551a and a second press bracket 551b.

The press module 550 may include a link 553. The link 553 may be hinged to a press bracket 551. For example, one end of the first link 553a may be hinged to a first press bracket 551a, and one end of the second link 553b may be hinged to a second press bracket 551b.

The press module 550 may include a press roller 557. The press roller 557 may include a rotation axis. The rotation axis of the press roller 557 may be coupled to the link 553. For example, both ends of the rotation axis of the press roller 557 may be rotatably coupled to the other end of the first link 553a and the other end of the second link 553b respectively.

The press module 550 may include a flexible part 555. The flexible part 555 may form an elastic force with respect to a change in length. The flexible part 555 may include a first flexible part 555a coupled to the first press bracket 551a and a second flexible part not shown coupled to the second press bracket 551b.

One end of the flexible part 555 is coupled to the press bracket 551, and the other end of the flexible part 555 may be coupled to the other end of the link 553. When the press roller 557 rises based on the press bracket 551, the length of the flexible part 555 may increase. The flexible part 555 may form an elastic force in a direction which suppresses the length change of the part 555. That is, when the press roller 557 rises based on the press bracket 551, the flexible part 555 may provide an elastic force in a downward direction to the press roller 557. And the press roller 557 may provide the elastic force provided from the flexible part 555 to the solar cell module 50 (see FIG. 18).

FIG. 23 is a figure showing a side view of a height adjustment housing, a height adjustment bar, and a connecting beam. The FIGS. 23(a) and (b) may represent different embodiments.

The height adjustment bar 523 and the height adjustment housing 521 shown in the FIG. 23(a) may be the height adjustment bar 523 and the height adjustment housing 521 shown in the FIGS. 11 to 19. The length of the height adjustment bar 523 may be adjusted by the height adjustment housing 521.

The distance between the height adjustment housing 521 and the connecting beam 530 may correspond to the length of the height adjustment bar 523. For example, if the distance between the height adjustment housing 521 and the connecting beam 530 is relatively small, the distance between the height adjustment housing 521 and the connecting beam 530 may also be relatively small. For example, if the distance between the height adjustment housing 521 and the connecting beam 530 is relatively large, the distance between the height adjustment housing 521 and the connecting beam 530 may also be relatively large.

Referring to the FIG. 23(b), the height adjustment bar 523 and the height adjustment housing 521 may be provided in a plural. That is, the height adjustment module 520 may be provided in a plural. For example, the height adjustment module 520 may include a front height adjustment module 5201 and a rear height adjustment module 5202.

The front height adjustment module 5201 may include a front height adjustment housing 5211 and a front height adjustment bar 5231. The rear height adjustment module 5202 may include a rear height adjustment housing 5212 and a rear height adjustment bar 5232.

The front height adjustment module 5201 and the rear height adjustment module 5202 may be coupled to the connecting beam 530. The front height adjustment module 5201 may be located in front of the rear height adjustment module 5202. The direction facing the front height adjustment module 5202 from the rear height adjustment module 5202 may be in parallel with the direction facing the front anti-tilting module 710 (see FIGS. 13 and 14) from the rear anti-tilting module 720 (see FIGS. 13 and 14).

The blade module 540 (see FIG. 18) works with the solar cell module 50 (see FIG. 18) and may give and receive pressure. In a process of decomposing the solar cell module 50 (see FIG. 18) while the blade module 540 (see FIG. 18) moves, the solar cell module 50 (see FIG. 18) may provide uneven pressure to the blade module 540 (see FIG. 18).

The height adjustment module 520 may be connected to the blade module 540 (see FIG. 18) by a connecting beam 530. The pressure provided by the solar cell module 50 (see FIG. 18) to the blade module 540 (see FIG. 18) may be delivered to the height adjustment module 520 via the connecting beam 530. The pressure transmitted to the height adjustment module 520 may be delivered to the guide module 310 via the transfer guide support module 510 (see FIG. 14.)

When a plurality of height adjustment modules 520 are arranged in a forward and backward direction, the pitch direction rotation of the blade module 540 (see FIG. 18) may be effectively suppressed. For example, the front height adjustment module 5201 may suppress the pitch angle of the blade module 540 (see FIG. 18) from being changed in a negative direction. For example, the rear height adjustment module 5202 may suppress the pitch angle of the blade module 540 (see FIG. 18) from being changed in a positive direction.

If the pitch direction rotation of the blade module 540 (see FIG. 18) is suppressed, the attitude of the blade module 540 (see FIG. 18) may be maintained more constantly. The pitch direction rotation of the blade module 540 (see FIG. 18) may be set based on the front direction of the solar cell module disassembling device 100 (see FIG. 18). For example, the pitch direction rotation of the blade module 540 (see FIG. 18) may mean a change in the shape in which the front end of the blade module 540 (see FIG. 18) rises or descends above the rear end of the blade module 540 (see FIG. 18).

Referring to FIGS. 11 to 23, the solar cell module disassembling device 100 according to the second embodiment of the invention may disassemble the solar cell module 50. That is, the solar cell module disassembling device 100 may separate the encapsulating material 58 attached to the glass 56. However, the scope of the invention is not limited to this.

For example, a solar cell module disassembling device 100 may disassemble a laminated panel. The laminated panel has a stacked structure and may mean a bonded panel. The laminated panel may include, for example, a laminated first panel and a second panel.

That is, the solar cell module disassembling device 100 may separate a second panel attached to the first panel from the first panel. The first panel is, for example, glass 56 and the second panel may be, for example, an encapsulating material 58. And the strength of the first panel may be different from the strength of the second panel. For example, the strength of the first panel may be greater than the strength of the second panel.

The height adjustment assembly may mean a front height adjustment module 5201 and a rear height adjustment module 5202 arranged in the forward and backward direction and coupled to the connecting beam 530. The height adjustment assembly may suppress the inclination of the blade module 540. And the anti-tilting unit 700 may suppress the inclination of the blade module 540. The blade posture forming assembly may mean at least one of an anti-tilting unit 700 and a height adjustment assembly.

In another example, referring to the FIG. 23(*a*), the height adjustment assembly may mean one height adjustment module 520. In this case, the height adjustment module 520 forming the height adjustment assembly forms a relatively large cross-sectional area, thereby suppressing the inclination of the blade module 540.

FIG. 24 is a figure showing a top view of a solar cell module disassembling device 100 according to a third embodiment of the invention.

Referring to FIG. 24, the solar cell module disassembling device 3100 according to a third embodiment of the invention may include a frame unit 3200. The frame unit 3200 may include a table module 3210 and a guide rail 3220. The guide rail 3220 may be referred to as a guide module.

The table module 3210 may include a stage 3211. The solar cell module 50 may be settled in the upper side of the stage 3211. The table module 3210 may include a support block 3212. The support block 3212 may have a shape upward protruding on the upper surface of the stage 3211. The support block 3212 may suppress movement of the solar cell module 50 in the stage 3211.

The frame unit 3200 may include a guide rail 3220. The guide rail 3220 may form the elongated shape in the longitudinal direction. The guide rail 3220 may be provided in plural. For example, the guide rail 3220 may include a first guide rail 3221 and a second guide rail 3222.

The first guide rail 3221 and the second guide rail 3222 may be adjacent to the stage 3211. The stage 3211 may be positioned between the first guide rail 3221 and the second guide rail 3222. Alternatively, the solar cell module 50 may be positioned between the first guide rail 3221 and the second guide rail 3222.

The solar cell module disassembling device 3100 may include a scraper unit 3300. The scraper unit 3300 may apply pressure to the solar cell module 50 to disassemble the module.

The scraper unit 3300 may include a first transverse beam 3330. The first end of the first transverse beam 3330 may be movably coupled to the first guide rail 3221. The second end of the first transverse beam 3330 may be movably coupled to the second guide rail 3222.

The scraper unit 3300 may include a blade module 3340. The blade module 3340 may be coupled to the first transverse beam 3330. The blade module 3340 may disassemble the solar cell module 50 while moving in the length direction of the guide rail 3220. The length direction of the guide rail 3220 may be forward and backward or longitudinal.

The scraper unit 3300 moves from one side of the solar cell module 50 to the other side, and may decompose the solar cell module 50. The other side of the solar cell module 50 may be located opposite to one side of the solar cell module 50. The side and the other side of the solar cell module 50 may be part of the edge of the solar cell module 50. The one side of the encapsulating material 58 (see FIG. 4) and the one side of the glass 56 (see FIG. 4) may form one side of the solar cell module 50. And the other side of the encapsulating material 58 (see FIG. 4) and the other side of the glass 56 (see FIG. 4) may form the other side of the solar cell module 50.

The solar cell module disassembling device 3100 may include a pre-processing unit 3400. The preprocessing unit 3400 may be positioned in front of the scraper unit 3300. The pre-processing unit 3400, may remove a region (hereinafter "one edge region") among whole region of the solar cell module 50. The one edge region is a region adjacent to an edge of the solar cell module 50. For example, the pre-processing unit 3400 may remove the one edge region of the encapsulating material 58 (see FIG. 1). In other words, the pre-processing unit 3400 can remove an upper portion of the one edge region of the solar cell module 50. As for the solar cell module 50 shown in FIG. 24, the encapsulating material 58 (see FIG. 4) may be positioned on the upper surface of the glass 56 (see FIG. 4).

The pre-processing unit 3400 may form a groove on a surface of the solar cell module 50. For instance, the pre-processing unit 3400 may form a groove on the encapsulating material 58 (see FIG. 4). The groove on the solar cell module 50, may be elongated in a transverse direction. The groove on the solar cell module 50, may be adjacent to the edge of the solar cell module 50. The groove of the solar cell module 50 can be formed alongside of the edge of the solar cell module 50. The groove on the solar cell module 50 can be at least one groove.

The one edge region which is configured to be removed by the pre-processing unit 3400, for another example, may include the edge of the solar cell module 50. In other words, the pre-processing unit 3400, may remove the edge of the encapsulating material 58 (see FIG. 4). Therefore, the one edge region including the edge of the encapsulating material 58 (see FIG. 4), can be removed.

The longitudinal direction of the groove formed on the encapsulating material 58 (see FIG. 4) may intersect with the direction of the movement of the scraper unit 3300. The direction of the movement of the scraper unit 3300, may be in parallel with the lengthwise direction of the guide rail 3220.

The first end portion of the pre-processing unit 3400 may be movably coupled to the first guide rail 3221. The second end portion of the pre-processing unit 3400 may be movably coupled to the second guide rail 3222.

When a groove is formed on the solar cell module 50 by the pre-processing unit 3400, the blade module 3340 may be positioned at the groove formed on the solar cell module 50. That is, the reference position of the blade module 3340 may be a groove formed on the solar cell module 50. For example, the reference position of the blade module 3340 may be a groove formed on the encapsulating material 58 (see FIG. 4). The blade module 3340 may start to move while applying pressure to the solar cell module 50 at the reference position.

In other words, the position where the blade module 3340 begins to apply pressure to the solar cell module 50 may be the reference position. Since the groove on the encapsulating material 58 (see FIG. 4) is at the reference position, the blade module 3340 may easily provide pressure to the encapsulating material 58 (see FIG. 4). In other words, due to the groove formed on the encapsulating material 58 (see FIG. 4), the blade module 3340 may easily provide pressure between the encapsulating material 58 (see FIG. 4) and the glass 56 (see FIG. 4).

The solar cell module disassembling device 3100 may include a suction unit 3600. The suction unit 3600 may be located behind the scraper unit 3300. The suction unit 3600 may be movably coupled to the guide rail 3220. For example, the first end portion of the suction unit 3600 may be movably coupled to the first guide rail 3221. For example, the second end portion of the suction unit 3600 may be movably coupled to the second guide rail 3222. The suction unit 3600 may inhale the debris generated during the decomposition process of the solar cell module 50.

The distance between the scraper unit 3300 and the pre-processing unit 3400 may be maintained within a certain distance. The distance between the scraper unit 3300 and the suction unit 3600, may be maintained within a certain distance.

A process in which a solar cell module disassembling device 3100 disassembles a solar cell module 50 may be described. In FIG. 24, the solar cell module 50 may be composed of the glass 56 (see FIG. 4) and the encapsulating material 58 (see FIG. 4). The encapsulating material 58 (see FIG. 4) may seem to be located above the glass 58 (see FIG. 4).

The solar cell module 50 may be loaded on the stage 3211. Another edge of the solar cell module 50 loaded on the stage 3211, may be in action with the support block 3212. The support block 3212 may suppress a forward movement of the solar cell module 50. The other edge of the solar cell module 50 may be positioned opposite to the edge of the solar cell module 50.

The pre-processing unit 3400 may be positioned opposite to the support block 3212. The pre-processing unit 3400 may be adjacent to the edge of the solar cell module 50. The pre-processing unit 3400 may form a groove on a surface of the solar cell module 50. For example, the pre-processing unit 3400 may form a groove on the encapsulating material 58 (see FIG. 4). The pre-processing unit 3400 may be separated from the module 50 after finishing forming the groove.

After the groove is formed on the solar cell module 50 by a pre-processing unit 3400, the blade module 3340 may move to the reference position. In order that the blade module 3340 moves to the reference position, the first transverse beam 3330 may move on the guide rail 3220. In order that the blade module 3340 moves to the reference position, the blade module 3340 may move up and down with respect to the first transverse beam 3330. For example, in order for the blade module 3340 to move to the reference position, the blade module 3340 may move downward from the first transverse beam 3330. For another example, in order for the blade module 3340 to move to the reference position, the first transverse beam 3330 may move up and down.

After the blade module 3340 moves to the reference position, the first transverse beam 3330 may move forward. When the first transverse beam 3330 moves forward, the blade module 3340 may move forward while providing pressure to the solar cell module 50. The point at which the blade module 3340 provides pressure to the solar cell module 50 may be a boundary between glass 56 (see FIG. 4) and encapsulating material 58 (see FIG. 4).

In the process in which the scraper unit 3300 moves forward, the pre-processing unit 3400 may not disturb the forward movement of the scraper unit 3300. Also, in the process in which the scraper unit 3300 moves forward, the pre-processing unit 3400 may not be in action with the solar cell module 50.

In the process in which the scraper unit 3300 moves forward and disassembles the solar cell module 50, the suction unit 3600 may inhale debris at the rear of the scraper unit 3300 the suction unit 3600 may be positioned behind the scraper unit 3300 within a certain distance. The debris may be generated from the glass 56 (see FIG. 4) or the encapsulating material 58 (see FIG. 4).

FIG. 25 is a figure showing the side view of the solar cell module disassembling device shown in FIG. 24. In FIG. 25, some components of the solar cell module disassembling device 3100 displayed may not be indicated for the convenience of description.

Referring to FIG. 25, the scraper unit 3300 may include a scraper movement module 3310. The scraper movement module 3310 may be movably coupled to the guide rail 3220.

The scraper unit 3300 may include a scraper support module 3320. The scraper support module 3320 may form an upwardly extending shape from the scraper movement module 3310. The scraper support module 3320 may be coupled to the scraper movement module 3310. Up and down direction length of the scraper support module 3320 may be adjusted.

The scraper unit 3300 may include a first transverse beam 3330. The first transverse beam 3330 may be coupled to the scraper support module 3320. For example, the lower portion of the scraper support module 3320 may be coupled to the scraper movement module 3310, and the upper portion of the scraper support module 3320 may be coupled to the first transverse beam 3330.

The scraper unit 3300 may include a blade module 3340. The blade module 3340 may be coupled to the first transverse beam 3330. According to the movement of the scraper movement module 3310, the forward and backward position of the blade module 3340 may be changed. According to expansion and contraction of the scraper support module 3320, the upward and downward position of the blade module 3340 may be changed. The blade module 3340 may move to the reference position through upward and downward position and forward and backward position change of the blade module 3340.

The pre-processing unit 3400 may include a pre-processing movement module 3410. The pre-processing movement module 3410 may be movably coupled to the guide rail 3220. The pre-processing unit 3400 may include a pre-processing support module 3420. The pre-processing support module 3420 may form a shape extending upwardly from the pre-processing movement module 3410. The pre-processing support module 3420 may be coupled to the pre-processing movement module 3410.

The pre-processing unit 3400 may include a second transverse beam 3430. The second transverse beam 3430 may be coupled to the pre-processing support module 3420. The lower portion of the pre-processing support module 3420 may be coupled to the pre-processing movement module 3410. The upper portion of the pre-processing support module 3420 may be coupled to the second transverse beam 3430.

The pre-processing unit 3400 may include a pre-processing module 3440. The pre-processing module 3440 may include a bracket 3441. The bracket 3441 may be movably coupled to the second transverse beam 3430. And the bracket 3441 may be supported by the second transverse beam 3430.

The pre-processing module 3440 may include a support bar 3443. The support bar 3443 may be connected to or/and coupled to the bracket 3441. The support bar 3443 may form a shape elongated downward from the bracket 3441.

The pre-processing module 3440 may include a cutter 3445. The cutter 3445 may be connected to or/and coupled to the support bar 3443. The cutter 3445 may form a groove by acting on the solar cell module 50. The cutter 3445 may include, for example, a disc wheel. The glass 56 may be exposed to the outside through a groove formed on the solar cell module 50 by the cutter 3445. In this case, the blade module 3340 may be in contact with the glass 56 exposed to the outside and move to disassemble the solar cell module 50. Therefore, the solar cell module 50 may be easily disassembled.

In order for the cutter 3445 to form a groove on the solar cell module 50, a need for the cutter 3445 to move to an initial position may occur. If the pre-processing movement module 3410 moves to forward and backward, the cutter 3445 may also move to forward and backward. If expansion and contraction of the pre-processing support module 3420 are generated, the cutter 3445 may move up and down. Due to expansion and contraction of the pre-processing support module 3420 and forward and backward movement of the pre-processing movement module 3410, the cutter 3445 may move to the initial position. The initial position is a start position for a cutter 3445 to form a groove on the solar cell module 50.

After the cutter 3445 is in its initial position, the bracket 3441 may move from the second transverse beam 3430. The bracket 3441 may move to the transverse direction along with the second transverse beam 3430. The transverse direction may intersect with the longitudinal direction. The longitudinal direction may be in parallel with the direction in which the scraper movement module 3310 moves. If the bracket 3441 moves in a transverse direction, the cutter 3445 may form a groove on the solar cell module 50.

The pre-processing module 3440 may form a plurality of grooves on the solar cell module 50. For example, the pre-processing module 3440 may form two grooves on the solar cell module 50. For example, the pre-processing module 3440 may form a first groove and a second groove on the solar cell module 50.

The cutter 3445 may form a first groove on the solar cell module 50 by moving in a transverse direction after moving to a first initial position. The cutter 3445 may move forward and go to a second initial position. The cutter 3445 may form a second groove on the solar cell module 50 by moving in a transverse direction from a second initial position. The first initial position may mean the position at which the first groove is started. And the second initial position may mean the position at which the second groove is started. To generalize this, the n initial position may mean the position at which the n-th groove is started. Here, n may be a natural number.

FIG. 26 is a figure showing a pre-processing module according to an embodiment of the invention. The FIGS. 26(*a*) and (*b*) show the pre-processing module 3440 viewed from different directions.

Referring to FIG. 26, the pre-processing module 3440 may include a bracket 3441. The bracket 3441 may be movably coupled to the second transverse beam 3430 (see FIG. 25). That is, the bracket 3441 may move from the first guide rail side 3221 (see FIG. 24) to the second guide rail side 3222 (see FIG. 24) along the second transverse beam 3430 (see FIG. 25) or move in the opposite direction.

The pre-processing module 3440 may include a support bar 3443. The support bar 3443 may form a shape elongated downward from the bracket 3441. The support bar 3443 may be integrally formed with the bracket 3441.

The pre-processing module 3440 may include a cutter 3445. The cutter 3445 may generally form a disc shape. The center of the outer circumferential surface of the cutter 3445 may form a wedge shape. For example, the cutter 3445 may be a disc wheel. In another example, the cutter 3445 may be at least one of a graver, a chisel, a grinding stone, a stone, a whetstone, and a metal/ceramic brush.

FIG. 27 is a figure showing a solar cell module disassembling device including a press plate according to an embodiment of the invention. The FIG. 27 may show the top view of the solar cell module disassembling device 3100. In FIG. 27, for the convenience of description, the indication of some phrases may be omitted.

Referring to FIG. 27, the solar cell module disassembling device 3100 may include a press plate 3500. The press plate 3500 may be movably coupled to the guide rail 3220. The press plate 3500 may provide pressure to the solar cell module 50. The solar cell module 50 may be positioned between the press plate 3500 and the stage 3211. The press plate 3500 may be located in front of the scraper unit 3300. And the press plate 3500 may be an embodiment of the press module 550 (see FIG. 5).

FIG. 28 is a figure showing operation of a press plate and a scraper unit according to an embodiment of the invention.

Referring to the FIG. 28(a), the press plate 3500 may be located in front of the scraper unit 3300. The scraper unit 3300 may be in a movement standby state at the reference position. The press plate 3500 may move in accordance with the movement of the scraper unit 3300. For example, if the scraper unit 3300 moves forward, the press plate 3500 may also move forward.

Referring to the b and c of FIG. 28, the scraper unit 3300 may move forward. For example, the scraper unit 3300 may move forward while applying pressure to the solar cell module 50. When the scraper unit 3300 moves forward while applying pressure to the solar cell module 50, the module 50 may be decomposed. For example, the encapsulating material 58 may be separated from the glass 56.

The point at which the scraper unit 3300 provides pressure to the solar cell module 50 may be a boundary between the glass 56 and the encapsulating material 58. The pressure provided by the scraper unit 3300 to the solar cell module 50 may be concentrated at a point hereinafter, a decomposition point where the scraper unit 3300 is in contact with the solar cell module 50. If the pressure provided by the scraper unit 3300 to the solar cell module 50 is dispersed at each point of the solar cell module 50 without being concentrated at the decomposition point, the encapsulating material 58 may be difficult to be separated from the glass 56.

The press plate 3500 may provide pressure to the solar cell module 50. That is, the press plate 3500 may fix the glass 56 to the stage 3211. As a result, the pressure provided by the scraper unit 3300 to the solar cell module 50 may be concentrated at the decomposition point. Therefore, the decomposition of the solar cell module 50 due to the press plate 3500 may be facilitated. In particular, the press plate 3500 may be effective when the glass 56 decomposes the damaged solar cell module 50.

FIG. 29 is a flow chart showing a method for disassembling a solar cell module according to an embodiment of the invention. FIG. 29 can be explained with FIGS. 24 to 28.

Referring to FIG. 29, the solar cell module disassembling method S10 may include a pre-processing step S100. In the pre-processing step S100, the pre-processing unit 3400 may form a groove on the solar cell module 50.

The solar cell module disassembling method S10 may include a separation step S200. In the separation step S200, the scraper unit 3300 may decompose the solar cell module 50. For example, the scraper unit 3300 may separate the encapsulating material 58 from the glass 56. In the separation step S200, the press plate 3500 may provide pressure to the solar cell module 50, in front of the scraper unit 3300. In the separation step S200, the suction unit 3600 may suck debris at the rear of the scraper unit 3300.

FIG. 30 is a figure showing a pre-processing step according to an embodiment of the invention. FIG. 30 may be described with FIGS. 24 to 29. In the FIGS. 24 to 29, the solar cell module disassembling device 3100 may include a controller. In addition, the solar cell module disassembling device 3100 may include an input unit. The input unit may obtain an input from a user. The controller may control the scraper unit 3300, the pre-processing unit 3400, the press plate 3500 and suction unit 3600.

Referring to FIG. 30, the pre-processing step S100 may include an input obtaining step S110. An input part of the solar cell module disassembling device 3100 may obtain an input for pre-processing. The input regarding the pre-processing may include information regarding the number of grooves formed on the solar cell module 50. For example, the number of grooves formed on the solar cell module 50 may be N which is a natural number. That is, in the input obtaining step S110, the solar cell module disassembling device 3100 may obtain an input of processing N turns. N may be referred to as an "input turn". If the pre-processing step S100 does not include an input obtaining step S110, the input turn N may be called a predetermined reference turn.

The pre-processing step S100 may include initial turn setting step S120. The pre-processing unit 3400 may have different moving directions in accordance with each turn among the N processing turns. The controller of the solar cell module disassembling device 3100 may perform the initial setting of the turns. The turn may be expressed as "n". The n may be referred to as "execution turn". The execution turn n may be set as "1" in this step S120.

The pre-processing step S100 may include an n-th cutting step S130. In this step S130, the controller may control the pre-processing unit 3400 to form an n-th groove on the solar cell module 50.

The pre-processing step S100 may include a comparing step S140. In this step S140, the solar cell module disassembling device 3100 may compare the execution turn n with the input turn N. If it is judged that the execution turn n and the input turn N are the same, the controller may terminate the pre-processing step S100.

The pre-processing step S100 may include a execution turn increasing step S150. The case in which the execution turn n is determined to be different from the input turn N, can be substantially same as the case in which the execution turn n is smaller than the input turn N. When it is determined that the execution turn n is different from the input turn N, the controller may increase the execution n as much as one. And the controller may perform the n-th cutting step S130.

FIG. 31 is a flow chart showing the n-th cutting step. FIG. 31 may be described with FIGS. 24 to 30.

Referring to FIG. 31, the n-th cutting step S130 may include a step S131 in which the controller moves the pre-processing module 3440 to the n-th initial position. In this step S131, the pre-processing module 3440 may be located at the n-th initial position. In order for the pre-processing module 3440 to be at the n-th initial position, the pre-processing module 3410 may move forward and backward, and the bracket 3441 may move traverse (transversely). The cutter 3445 may move up and down by the expansion and contraction of the pre-processing support module 3420.

The n-th cutting step S130 may include a cutting traverse step S132. This step S132 may be referred to as "cutting transversely". In this step S132, the controller may move the bracket 3441 along the second transverse beam 4430. When the bracket 3441 moves along the second transverse beam 3430, the cutter 3445 may move in a transverse direction at the n-th initial position. In this step S132, an n-th groove may be formed the solar cell module 50 by the cutter 3445. The n-th groove may be elongated transversely.

FIG. 32 is a flow chart showing a separation step S200 according to an embodiment of the invention. FIG. 32 may be described with FIGS. 24 to 31.

Referring to FIG. 32, the separation step S200 may include a step S210 in which the controller moves the blade module 3340 to the reference position. In this step S110, the blade module 3340 may move in the forward and backward direction by the movement of the scraper movement module 3310. And the scraper support module 3320 may move up and down by expansion and contraction.

The separation step S200 may include moving forward and scraping step S220. In this step S220, the blade module 3340 can move forward by the forward movement of the scraper movement module 3310.

In this step S220, the press plate 3500 may provide pressure to the solar cell module 50 while being located in front of the blade module 3340. In this case, the distance between the press plate 3500 and the blade module 3340 may be maintained within a certain range.

The separation step S200 may include moving forward and inhaling debris step S230. In this step S230, the suction unit 3600 may inhale debris as the suction unit 3600 moves forward while being positioned behind the blade module 3340.

Referring to the FIGS. 24 to 32, the solar cell module disassembling device 3100 may disassemble the solar cell module 50. That is, the solar cell module disassembling device 3100 may separate the encapsulating material 58 attached to the glass 56. However, the scope of the invention is not limited to this.

For example, a solar cell module disassembling device 3100 may disassemble a laminated panel. The laminated panel has a stacked structure and may mean a bonded panel. The laminated panel may include, for example, a laminated first panel and a second panel.

That is, the solar cell module disassembling device 3100 may separate a second panel from the first panel. The first panel is, for example, glass 56 and the second panel may be, for example, an encapsulating material 58. The strength of the first panel may be different from the strength of the second panel. For example, the strength of the first panel may be greater than the strength of the second panel.

The pre-processing unit 3400 may be positioned in front of the scraper unit 3300 without acting with the solar cell module 50. For example, although not shown in the figure, the pre-processing unit 3400 moves upward in the solar cell module 50 after forming a groove in the solar cell module 50 and may not interfere with the movement of the scraper unit 3300. For this, the pre-processing unit 3400 may not be coupled to the guide rail 3220. For example, the frame unit 3200 may include an outer frame adjacent to the guide rail 3220. The outer frame may include a first outer frame and a second outer frame. The guide rail 3220 may be positioned between the first outer frame and the second outer frame. The first end of the pre-processing unit 3400 may be coupled to the first outer frame. The second end of the pre-processing unit 3400 may be coupled to the second outer frame. The pre-processing module 3440 may move upward after forming a groove in the solar cell module 50 or removing a portion of the solar cell module 50. If the pre-processing module 3440 moves upward, the scraper unit 3300 may move through the space formed on the lower part of pre-processing module 3440. In another example, the pre-processing module 3440 may move in a transverse direction after forming a groove in the solar cell module 50 or removing a portion of the solar cell module 50. If the pre-processing module 3440 moves more in the transverse direction, the scraper unit 3300 may move in a state that does not work with the pre-processing unit 3400.

For example, a pre-processing movement module 3410 may be coupled to an outer frame. The pre-processing support module 3420 may be coupled to the pre-processing movement module 3410 and it may expand and contract. The second transverse beam 3430 may be coupled to the pre-processing support module 3420. The outer frame may have the forward and backward elongated shape. The pre-processing module 3410 may move forward and backward in the outer frame.

In another example, a pre-processing support module 3420 may be coupled to an outer frame. The pre-processing support module 3420 may expand and contract. The second transverse beam 3430 may be coupled to the pre-processing support module 3420. The second transverse beam 3430 may be positioned higher than the scraper unit 3300. The pre-processing module 3440 may be movably coupled to the second transverse beam 3430. If the pre-processing module 3440 is positioned adjacent to the outer frame, the scraper unit 3300 may be moved forward by passing under the second transverse beam 3430.

In a method for decomposing a solar cell module S10, a controller may control a scraper unit 3300, a pre-processing unit 3400, a press plate 3500, and a suction unit 3600. That is, the drive or operation of each scraper unit 3300, pre-processing unit 3400, press plate 3500, and suction unit 3600 may be controlled by the controller.

FIG. 33 is a figure showing a method for disassembling a solar cell module S20 according to another embodiment of the invention. FIG. 33 may be described with FIGS. 1 to 10.

Referring to FIG. 33, the solar cell module disassembling method S20 may include inputting solar cell module S2100. For example, in this step S2100, the solar cell module 50 (see FIG. 3) may be located in the stage 241 (see FIG. 3). In this step S2100, the blade module 540 (see FIG. 4) may be in a state of being spaced apart from the solar cell module 50 (see FIG. 4). This step S2100 may be performed, for example, by a control unit 810 (see FIG. 10).

The solar cell module disassembling method S20 may include preparing scraper step S2200. In this step S2200, the blade module 540 may approach the solar cell module 50 (see FIG. 4). In this step S2200, the blade module 540 may form a preparation posture for disassembling the solar cell module 50. In other words, in this step S2200, the blade module 540 may be located at the reference position. For example, in this step S2200, the blade module 540 may be located at the rear end of the solar cell module 50.

This step S2200 may be performed, for example, by a control unit 810 (see FIG. 10). In this step S2200, the sensor unit 820 (see FIG. 10) provides information related to the position and/or thickness of the solar cell module 50 to the control unit 810 (see FIG. 10). And the control unit 810 (see FIG. 10) may position the blade module 540 at the reference position based on the information received from the sensor unit 820 (see FIG. 10).

The solar cell module disassembling method S20 may include decomposing solar cell module S2300. In this step S2300, the scraper unit 500 (see FIGS. 5 to 7) may move forward. For example, in this step S2300, the scraper unit 500 (see FIGS. 5 to 7) may move toward the front end of the solar cell module 50.

This step S2300 may be performed, for example, by the control unit 810 (see FIG. 10). In this step S2300, for example, the control unit 810 (see FIG. 10) may control the movement and/or posture of the blade module 540 based on real-time information received from the sensor unit 820 (see FIG. 10).

The solar cell module disassembling method S20 may include discharging step S2400. This step S2400 may be performed after the scraper unit 500 (see FIG. 7) is located at the front end of the solar cell module 50. In this step S2400, a plurality of solar cell module transfer rollers 250 may rise and rotate after being in contact with glass 56 (see FIG. 8) to discharge glass 56 (see FIG. 8) to the outside.

This step S2400 may be performed, for example, by the control unit 810 (see FIG. 10). For example, it is judged based on real-time position information of the blade module 540 provided by the sensor unit 820 (see FIG. 10) that the blade module 540 is located on the front end of the solar cell module 50, the control unit 810 (see FIG. 10) may operate the solar cell module transfer roller 250 in the step S2400.

FIG. 34 is a figure showing the solar cell module.

Referring to FIG. 34, the back side of the solar cell module 50 may be observed. The solar cell module 50 may include a solar panel 51. In FIG. 34, the back side of the solar panel 51 may be observed. The solar panel 51 may generate electrical energy by reacting to the light.

The solar cell module 50 may include a solar cell module frame 53. The solar cell module frame 53 may be located on the edges of the solar panel 51. The solar cell module frame 53 may be coupled to the solar panel 51. The solar cell module frame 53 may support the solar panel 51.

The solar cell module 50 may include a junction box 55. The junction box 55 may be coupled to the solar panel 51. In particular, the junction box 55 may be coupled to the back side of the solar panel 51. The junction box 55 may include at least one electronic component. The junction box 55 may be electrically connected to, for example, a solar panel 51 to receive power. And the junction box 55 may be electrically connected to the cable 57. Electric power provided to the junction box 55 from the solar panel 51 may be transmitted to the cable 57.

The decomposition of the solar cell module 50 may be considered. The solar cell module 50 that has reached the end of its life span may be disassembled and used for recycling. For example, the junction box 55 including valuable metals may be recycled. The solar cell module disassembling device according to the fourth embodiment of the invention may separate the junction box 55 from the solar panel 51. Therefore, the junction box 55 may be recycled. The invention may provide a device capable of effectively separating the junction box 55 from the solar panel 51.

FIG. 35 is a figure showing a solar cell module disassembling device 4100 according to a fourth embodiment of the invention.

Referring to FIG. 35, the solar cell module disassembling device 4100 may include a frame unit 4200. The frame unit 4200 may be positioned on the upper part of the solar panel 51. The frame unit 4200 may perform vertical movement or/and horizontal movement based on the solar panel 51. The solar panel 51 may locate on the horizontal plane.

The frame unit 4200 may include a first frame unit 4210 and a second frame unit 4220. The first frame unit 4210 may move with respect to the solar panel 51. The second frame unit 4220 may be connected to, coupled to or fixed to the first frame unit 4210. The second frame unit 4210 may be integrally formed with the first frame unit 4210.

The solar cell module disassembling device 4100 may include a first blade unit 4300 and a second blade unit 4400. The first blade unit 4300 and the second blade unit 4400 may move with respect to the frame unit 4200. For example, the first blade unit 4300 and the second blade unit 4400 may move toward each other or/and move away from each other.

The solar cell module disassembling device 4100 may include a drive unit 4500. The drive unit 4500 may be coupled to or fixed to the frame unit 4200. The drive unit 4500 may be coupled to the first blade unit 4300 and the second blade unit 4400. For example, the drive unit 4500 may provide driving force to the first blade unit 4300 and the second blade unit 4400.

The drive unit 4500 may include a driving screw 4510. The driving screw 4510 may have a shape which is elongated in the longitudinal direction. The longitudinal direction of the driving screw 4510 may be in parallel with the direction from the first blade unit 4300 to the second blade unit 4400. The driving screw 4510 is coupled to the first blade unit 4300 and the second blade unit 4400 to provide a driving force. The driving screw 4510 has the shape of the cylinder. The thread may be formed on the exterior of the driving screw 4510. The thread formed on the driving screw 4510 may be coupled to the first blade unit 4300 and the second blade unit 4400.

The drive unit 4500 may include a rotation support 4520. The rotation support 4520 may be coupled to or fixed to the frame unit 4200. And the rotation support 4520 may be coupled to the driving screw 4510. The driving screw 4510 may be inserted into the rotation support 4520. The driving screw 4510 may rotate in the rotation support 4520.

In another example, a rotation support 4520 may form a hollow portion therein. The hollow portion of the rotation support 4520 may be elongated alongside of the longitudinal direction of the driving screw 4510.

The rotation support 4520 may include a first rotation support portion 4521 and a second rotation support portion 4522. The first rotation support portion 4521 and second rotation support portion 4522 may be coupled to both ends of the driving screw 4510 respectively.

The drive unit 4500 may include a motor 4530. The motor 4530 may be coupled to the frame unit 4200. The motor 4530 may provide the rotatory force to the driving screw 4510. In FIG. 35, for the convenience of description, the view in which the motor 4530 is coupled to the frame unit 4200 may be omitted.

The drive unit 4500 may include a driving force transfer member 4540. The driving force transfer member 4540 is provided with the driving force from the motor 4530 and it may deliver it to the driving screw 4510. The driving force transfer member 4540 has a belt shape in FIG. 35, but the invention is not limited to this. For example, the driving force transfer member 4540 may have the shape of a chain or a gear.

The first blade unit 4300 may include a first drive connection part 4310. The first drive connection part 4310 may be coupled to the driving screw 4510. For example, a driving screw 4510 may be inserted into a first drive connection part 4310. The thread may be formed inside the first drive connection part 4310. The thread formed in the first drive connection part 4310 may be coupled to the thread formed in the driving screw 4510.

The first blade unit 4300 may include a first support portion 4320. The first support portion 4320 may include a first horizontal support portion 4321 and a first vertical support portion 4323. The first horizontal support portion 4321 may be coupled to or fixed to the first drive connection part 4310. The first vertical support portion 4323 may be coupled to or fixed to the first horizontal support portion 4321. The first vertical support portion 4323 may be located below the first horizontal support portion 4321. The first vertical support portion 4323 may be integrally formed with the first horizontal support portion 4321.

The first blade unit 4300 may include a first blade module 4330. The first blade module 4330 may be coupled to or fixed to the first support portion 4320. For example, the first blade module 4330 may be coupled to or fixed to the first vertical support portion 4323. The first blade module 4330 may be positioned below the first vertical support portion 4323. The first blade module 4330 may be positioned under the first horizontal support portion 4321 and may be separated. A first gap 4340 may be formed between the first blade module 4330 and the first horizontal support portion 4321.

The first gap 4340 may mean a space between the first blade module 4330 and the first horizontal support portion 4321.

The second blade unit 4400 may include a second support portion 4320. The second support portion 4420 may include a second horizontal support portion 4421 and a second vertical support portion 4423. The second horizontal support portion 4421 may be coupled to or fixed to the second drive connection part 4410. The second vertical support portion 4423 may be coupled to or fixed to the second horizontal support portion 4421. The second vertical support portion 4423 may be located below the second horizontal support portion 4421. The second vertical support portion 4423 may be integrally formed with the second horizontal support portion 4421. The second support portion 4420 may be separated from the first support portion 4320. The second support portion 4420 and the first support portion 4320 may be positioned in the longitudinal direction of the driving screw 4510.

The second blade unit 4400 may include a second blade module 4430. The second blade module 4430 may be coupled to or fixed to the second support portion 4420. For example, a second blade module 4430 may be coupled to or fixed to a second vertical support portion 4423. The second blade module 4430 may be positioned at the lower part of the second vertical support portion 4423. The second blade module 4430 may be positioned under the second horizontal support portion 4421 and may be separated. A second gap 4440 may be formed between the second blade module 4430 and the second horizontal support portion 4421. The second gap 4440 may mean a space between the second blade module 4430 and the second horizontal support portion 4421.

The first blade unit 4300 and the second blade unit 4400 may move along the driving screw 4510 by rotation of the driving screw 4510. For example, if the driving screw 4510 rotates in a first rotation direction, the first blade unit 4300 and the second blade unit 4400 may move to approach each other. For example, if the driving screw 4510 rotates in a second rotation direction, the first blade unit 4300 and the second blade unit 4400 may move to be away from each other. The second rotation direction may mean the opposite direction of the first rotation direction.

In a state where the junction box 55 is positioned between the first blade unit 4300 and the second blade unit 4400, the driving screw 4510 may rotate in a first rotation direction. If the driving screw 4510 rotates in a first rotation direction, the first blade unit 4300 and the second blade unit 4400 may move toward the junction box 55. The first blade unit 4300 and the second blade unit 4400 may have a wedge shape. If the first blade unit 4300 and the second blade unit 4400 move toward the junction box 55, the first blade unit 4300 and the second blade unit 4400 may provide pressure to the junction box 55. If the first blade unit 4300 and the second blade unit 4400 provide pressure to the junction box 55, the first blade unit 4300 and the second blade unit 4400 may separate the junction box 55 from the solar panel 51.

FIG. 36 is a figure showing a driving screw 4510 according to an embodiment of the invention.

Referring to FIG. 36, the driving screw 4510 may be elongated in a direction. For example, a driving screw 4510 may include a longitudinal cylindrical shape. The longitudinal direction of the driving screw 4510 may be in parallel with the direction from the first end 4515 to the second end 4516.

The driving screw 4510 may include a driving screw body 4511. The driving screw body 4511 may have a cylindrical shape. And the driving screw body 4511 may be formed with the metal material.

The driving screw 4510 may include a first end 4515 and a second end 4516. The first end 4515 may mean one end of the driving screw body 4511. The second end 4516 may mean the other end of the driving screw body 4511. The first end 4515 may be coupled to the first rotation support portion 4521 (see FIG. 35). The second end 4516 may be coupled to the second rotation support portion 4522 (see FIG. 35).

The driving screw 4510 may include a thread. For example, the first thread 4513 and the second thread and 4514 may mean threads formed on the outer surface of the driving screw body 4511. The first thread 4513 may be adjacent to the first end 4515. The second thread 4514 may be adjacent to the second end 4516.

The threads 4513, 4514 may mean at least one of the first thread 4513 and the second thread 4514. The threads 4513, 4514 may be coupled to the drive connection part 4310, 410 (see FIG. 35). The drive connection part 4310, 4410 (see FIG. 35) may mean at least one of the first drive connection part 4310 (see FIG. 35) and the second drive connection part 4410 (see FIG. 35). For example, a first thread 4513 may be coupled to a first drive connection part 4310 (see FIG. 35). For example, a second thread 4514 may be coupled to a second drive connection part 4410 (see FIG. 35).

The driving screw 4510 may include a pulley 4519. The pulley 4519 may be located at one of the first end 4515 and the second end 4516. For example, a pulley 4519 may be located at a first end 4515. The pulley 4519 may have a shape elongated from the driving screw body 4511.

The pulley 4519 is provided the rotatory power from motor 4530 (see FIG. 35) and it may offer it to the driving screw body 4511. When the driving screw body 4511 rotates, the threads 4513, 4514 may transfer the rotatory force to the drive connection parts 4310, 4410 (see FIG. 35). The drive connection parts 4310, 4410 (see FIG. 35) may convert the rotatory force of the driving screw body 4511 into translational movement. That is, when the driving screw body 4511 rotates, the drive connection parts 4310, 4410 (see FIG. 35) may move along the driving screw body 4511.

FIG. 37 is a figure showing a part of the cross section cutting the solar cell module disassembling device 4100 shown in FIG. 35 in the lengthwise direction of the driving screw body 4511. In FIG. 37, a portion of the first blade unit 4300, a portion of the second blade unit 4400, a junction box 55, and a solar panel 51 may be observed.

Referring to FIG. 37, the first blade unit 4300 and the second blade unit 4400 may be located on the upper part of the solar panel 51. The junction box 455 may be positioned between the first blade unit 4300 and the second blade unit 4400.

The first vertical support portion 4323 may be coupled to or fixed to the first horizontal support portion 4321. The first vertical support portion 4323 may be positioned under the first horizontal support portion 4321. The first blade module 4330 may be coupled to or fixed to the first vertical support portion 4323. The first blade module 4330 may have a structure that may be easily exchanged. For example, the first blade module 4330 may be coupled to the first vertical support portion 4323 by a bolt. The first gap 4340 may be a space formed by a first blade module 4330, a first horizontal support portion 4321, and a first vertical support portion 4323. The first gap 4340 may be opened toward the second blade unit 4400.

The second vertical support portion 4423 may be coupled to or fixed to the second vertical support portion 4421. The second vertical support portion 4423 may be positioned under the second horizontal support portion 4421. The second blade module 4430 may be coupled to or fixed to the second vertical support portion 4423. The second blade module 4430 may have a structure that may be easily exchanged. For example, the second blade module 4430 may be coupled to the second vertical support portion 4423 by a bolt. The second gap 4440 may be a space formed by a second blade module 4430, a second horizontal support portion 4421, and a second vertical support portion 4423. The second gap 4440 may be opened toward the first blade unit 4300.

FIG. 38 is a figure showing a first blade module and a second blade module.

Referring to the FIG. 38(a), a top view of the first blade module 4330 and the second blade module 4430 may be observed. The first blade module 4330 may include a first blade body 4331 and a first cutting portion 4332. The first blade body 4331 may be coupled to the first support portion 4320 (see FIG. 35). The first cutting portion 4332 may form a tapered shape.

The first cutting portion 4332 may have a shape elongated from the first blade body 4331. For example, the first cutting portion 4332 may form an elongated shape from the first blade body 4331 toward the second blade module 4430.

The first cutting portion 4332 may face the second blade module 4430. The first cutting portion 4332 may be inclined with respect to the longitudinal direction of the driving screw 4510 (see FIG. 35). The first cutting portion 4332 may have a cross section which becomes smaller as it approaches the second blade module 4430. That is, the first cutting portion 4332 may have a cross section which becomes smaller as the first blade body 4331 is getting closer to the edge of the first cutting portion 4332. The edge of the first cutting portion 4332 may be located on a horizontal surface formed by the solar panel 51 (see FIG. 35).

The second blade module 4430 may include a second blade body 4431 and a second cutting portion 4432. The second blade body 4431 may be coupled to the second support portion 4420 (see FIG. 35). The second cutting portion 4432 may form a tapered shape.

The second cutting portion 4432 may have a shape elongated from the second blade body 4431. For example, a second cutting portion 4432 may form an elongated shape from a second blade body 4431 toward the first blade module 4330. The second cutting portion 4432 may have a cross section which becomes smaller as it approaches the first blade module 4330. That is, the second cutting portion 4432 may have a cross section which becomes smaller as the second blade body 4431 is getting closer to the edge of the second cutting portion 4332. The edge of the second cutting portion 4432 may be located on a horizontal surface formed by the solar panel 51 (see FIG. 35).

The second cutting portion 4432 may face the first blade module 4330. The second cutting portion 4432 may be inclined with the longitudinal direction of the driving screw 4510 (see FIG. 35). The edge of the second cutting portion 4432 may be in parallel with the edge of the first cutting portion 4332.

The first cutting portion 4332 and the second cutting portion 4432 may form the shape of the sawtooth generally. The shape of the second cutting portion 4432 may correspond to the shape of the first cutting portion 4332. For example, a concave part of the second cutting portion 4432 may correspond to a convex shape of the first cutting portion 4332. For example, a convex part of the second cutting portion 4432 may correspond to a concave shape of the first cutting portion 4332. The first cutting portion 4332 and the second cutting portion 4432 may have an engaged shape when approaching each other.

The FIG. 38(b) is a figure showing a cross section cutting a first blade module 4330 and a second blade module 4430 shown in the FIG. 38(a) along A1-A2.

Referring to the FIG. 38(b), a first blade inclined surface 4333, a first blade lower surface 4335, and a first blade upper surface 4337 may form a part of an outer surface of the first blade module 4330. The second blade inclined surface 4433, the second blade lower surface 4435, and the second blade upper surface 4437 may form a part of the outer surface of the second blade module 4430.

The first blade lower surface 4335 may form a lower surface of the first blade module 4330. The lower surface of the first blade 4335 may face the solar panel 53 (see FIG. 35). The first blade upper surface 4337 may form the upper surface of the first blade module 4330. The upper surface of the first blade 4337 may face the first horizontal support portion 4321 (see FIG. 35) and be separated.

The first blade inclined surface 4333 may be formed on the first cutting portion 4332. The first blade inclined surface 4333 extends from the first blade lower surface 4335 and may lead to the first blade upper surface 4337. The first blade inclined surface 4333 may form a slope with respect to the first blade lower surface 4335. For example, a first blade inclined surface 4333 may approach a first blade lower surface 4335 as it moves toward the second blade module 4430. For example, the first blade inclined surface 4333 and the first blade lower surface 4335 may form an acute angle. For example, the first blade incline surface 4333 and the first blade upper surface 4337 may form an obtuse angle.

The second blade lower surface 4435 may form a lower surface of the second blade module 4430. The second blade lower surface 4435 may face the solar panel 53 (see FIG. 35). The second blade upper surface 4437 may form an upper surface of the second blade module 4430. The upper surface of the second blade 4437 may face the second horizontal support portion 4421 (see FIG. 35) and be separated.

The second blade inclined surface 4433 may be formed on the second cutting portion 4432. The second blade inclined surface 4433 extends from the second blade lower surface 4435 and may lead to the second blade upper surface 4437. The second blade inclined surface 4433 may form a slope with respect to the second blade lower surface 4435. For example, a second blade inclined surface 4433 may approach a second blade lower surface 4435 as it moves toward the first blade module 4330. For example, the second blade inclined surface 4433 and the second blade lower surface 4435 may form an acute angle. For example, the second blade inclined surface 4433 and the second blade upper surface 4437 may form an obtuse angle.

The first blade inclined surface 4333 may face the upper portion and diagonally face the second blade module 4430. The distance between the first blade upper surface 4337 and the second blade upper surface 4437 may be greater than the distance between the first blade lower surface 4335 and the second blade lower surface 4435.

FIG. 39 is a figure showing a first blade module 4330 and a second blade module 4430 according to various embodiments of the invention. In FIG. 39, the first blade module 4330 and the second blade module 4430 may be observed from the upper part.

Referring to FIG. 39, the first cutting portion 4332 may form a shape elongated from the first blade body 4331 toward the second blade module 4430. The second cutting portion 4432 may form a shape elongated from the second blade body 4431 toward the first blade module 4330. The first cutting portion 4332 may form a first inclined surface 4332 (see FIG. 38). The second cutting portion 4432 may form a second inclined surface 4432 (see FIG. 38).

Referring to the FIG. 39(a), the first cutting portion 4332 may face the second blade module 4430 frontally. The second cutting portion 4432 may frontally face the first blade module 4330. The edge of the first cutting portion 4332 may be in parallel with the edge of the second cutting portion 4432.

Referring to the b and c of FIG. 39, the first cutting portion 4332 may form a concave shape toward the second blade module 4430. The second cutting portion 4432 may form a convex shape toward the first blade module 4330. The shape of the second cutting portion 4432 may correspond to the shape of the first cutting portion 4332. The edge of the first cutting portion 4332 and the edge of the second cutting portion 4432 may have angular shapes in the FIG. 39(b), respectively. On the other hand, the edge of the first cutting portion 4332 and the edge of the second cutting portion 4432 may have a curved shape in c of the FIG. 39, respectively.

Referring to the d of FIG. 39, the first cutting portion 4332 may face the second blade module 4430 diagonally, and the second cutting portion 4432 may face the first blade module 4330 at an angle. The edge of the first cutting portion 4332 may be in parallel with the edge of the second cutting portion 4432.

Referring to FIGS. 38 and 39, the first blade module 4330 and the second blade module 4430 may have various shapes. The blade modules 4330, 4430 may mean at least one of the first blade module 4330 and the second blade module 4430.

Various shapes of blade modules 4330, 4430 may be selected according to the object to be cut. For example, the shape of the blade modules 4330, 4430 may vary depending on the distribution of the coupling force between the junction box 55 (see FIG. 35) and the solar panel 51 (see FIG. 35).

FIG. 40 is a figure showing the first blade unit and the second blade unit shown in FIG. 37 approaching each other.

Referring to FIG. 40, the first blade unit 4300 and the second blade unit 4400 may move and approach each other. That is, the first blade unit 4300 may move toward the second blade unit 4400, and the second blade unit 4400 may move toward the first blade unit 4300.

When the first blade unit 4300 and the second blade unit 4400 move to approach each other, the first blade module 4330 may provide pressure to the junction box 55. The first pressure may mean the pressure provided by the first blade module 4330 to the junction box 55.

When the first blade unit 4300 and the second blade unit 4400 move to approach each other, the second blade module 4430 may provide pressure to the junction box 55. The second pressure may mean the pressure provided by the second blade module 4430 to the junction box 55.

The junction box 55 may be separated from the solar panel 51 by the first pressure and the second pressure. When the first blade unit 4300 and the second blade unit 4400 approach each other while the junction box 55 is separated from the solar panel 51, the junction box 55 may be in contact with the first blade inclined surface 4333 (see FIG. 38) and the second blade inclined surface 4433 (see FIG. 38).

The first blade module 4330 and the second blade module 4430 may cut a bus bar ribbon 59 having a shape elongated from a lower surface of the junction box 55 to a lower portion. By cutting the bus bar ribbon 59, the junction box 55 may be completely separated from the solar panel 51. The bus bar ribbon 59 may mean a cable connecting the junction box 55 and the solar panel 51.

The junction box 55 separated from the solar panel 51 may be accommodated by the first blade unit 4300 and the second blade unit 4400. For example, a junction box 55 may be accommodated by a first gap 4340 (see FIG. 37) and a second gap 4440 (see FIG. 37).

When the first blade unit 4300 and the second blade unit 4400 move away from each other, the junction box 55 may be separated from the first blade unit 4300 and the second blade unit 4400 and descend. With this process, the efficiency of the junction box 55 removal process may be improved.

Referring to FIGS. 34 to 40, the process of disassembling the solar cell module 50 by the solar cell module disassembling device 4100 may be described. For example, the solar cell module disassembling device 4100 may separate the junction box 55 from the solar panel 51

The junction box 55 may be mechanically or/and chemically coupled to a solar panel 51. The junction box 55 may be coupled, for example, to a solar panel 51 with an adhesive. The heat may be added in the coupling surface between the solar panel 51 and the junction box 55. When heat is applied to the coupling surface between the junction box 55 and the solar panel 51, the junction box 55 may be easily separated from the solar panel 51. For example, if heat is applied to at least one of the junction box 55 and the solar panel 51, the blade modules 4330, 4430 may relatively easily enter into between the junction box 55 and the solar panel 51.

For example, the blade units 4300, 4400 may provide heat to at least one of a junction box 55 and a solar panel 51. The blade units 4300, 4400 may mean at least one of the first blade unit 4300 and the second blade unit 4400. For example, the blade units 4300, 4400 may be heated and maintain a relatively high temperature. In another example, a solar cell module disassembling device 4100 may have a separate component providing heat to at least one of a junction box 55 and a solar panel 51. For example, an IR heater may be included in a solar cell module disassembling device 4100 to provide heat. For example, the IR heater may heat the entire junction box 55 from the top.

The heat provided to at least one of the junction box 55 and the solar panel 51 may soften the sealant around the junction box 55. The process of providing heat to at least one of the junction box 55 and the solar panel 51 may be understood as a pre-process or a preliminary process.

Ultrasounds may be provided to at least one of a junction box 55 and a solar panel 51. For example, a solar cell module disassembling device 4100 may have a separate component providing ultrasounds to at least one of a junction box 55 and a solar panel 51. A separate component that provides ultrasonic waves to the junction box may be referred to as an ultrasonic unit.

In another example, the blade units 4300, 4400 may provide ultrasonic waves to at least one of the junction box 55 and the solar panel 51. If ultrasonic waves are provided to at least one of the junction box 55 and the solar panel 51, the junction box 55 may be relatively easily separated from the solar panel 51.

The drive unit 4500 may provide driving force to the blade units 4300, 4400. For example, the drive unit 4500 may provide a driving force to the blade units 4300, 4400 by having a driving screw 4510. The blade units 4300, 4400 may move if they are provided with driving force.

In another example, although not shown in the figure, the drive unit 4500 may provide a driving force to the blade units 4300, 4400 in a hydraulic manner. For example, the drive unit 4500 may include a hydraulic drive module coupled to or fixed to the frame unit 4200 and coupled to the blade units 4300, 4400 to move them 4300, 4400.

The first blade module 4330 and the second blade module 4430 may approach the junction box 55 from both sides and separate the box 55 from the solar panel 51. In another example, one of the first blade module 4330 and the second blade module 4430 maintains a stationary state, and the other moves toward the junction box 55, thereby separating the junction box 55 from the solar panel 51.

The process of cutting the bus bar ribbon 59 may be described. Even after the blade module 4330, 4430 separates the junction box 55 from the solar panel 51, a state in which the bus bar ribbon 59 is coupled to the solar panel 51 can be maintained. The blade modules 4330, 4430 may cut the bus bar ribbon 59.

The bus bar ribbon 59 may include a large area and a small area towards the blade module 4330, 4430. The blade modules 4330, 4430 enter the small area direction of the bus bar ribbon 59, thereby effectively cutting the ribbon 59. For this, appropriate blade modules 4330, 4430 among the shapes of various blade modules 4330, 4430 shown in FIG. 6 may be selected.

The drive connection parts 4310, 4410 may mean at least one of the first drive connection part 4310 and the second drive connection part 4410. The support portions 4320, 4420 may mean at least one of the first support portion 4320 and the second support portion 4420. The horizontal support portions 4321, 4421 may mean at least one of first horizontal support portion 4321 and second horizontal support portion 4421. The vertical support portions 4323, 4423 may mean at least one of the first vertical support portion 4323 and the second vertical support portion 4423. The blade bodies 4331, 4431 may mean at least one of the first blade body 4331 and the second blade body 4431. The cutting portions 4332, 4432 may mean at least one of the first cutting portion 4332 and the second cutting portion 4432. The blade inclined surfaces 4333, 4433 may mean at least one of the first blade inclined surface 4333 and the second blade inclined surface 4433. The blade lower surfaces 4335, 4435 may mean at least one of a first blade lower surface 4335 and a second blade lower surface 4435. The blade upper surfaces 4337, 4437 may mean at least one of a first blade upper surface 4337 and a second blade upper surface 4437. The gaps 4340, 4440 may mean at least one of the first gap 4340 and the second gap 4440.

The threads 4513, 4514 may mean at least one of the first thread 4513 and the second thread 4514. The rotation support portions 4521, 4522 may mean at least one of the first rotation support portion 4521 and the second rotation support portion 4522. The ends 4515, 4516 may mean at least one of the first end 4515 and the second end 4516.

Certain embodiments or other embodiments of the invention described above are not mutually exclusive or distinct from each other. Any or all elements of the embodiments of the invention described above may be combined or coupled to each other in configuration or function.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell module disassembling device comprising:
   a frame unit,
     wherein a laminated panel having a first panel and a second panel is mounted on the frame unit, and
     wherein the first and second panels are stacked and bonded;
   a guide module, being elongated in a forward and backward direction;
   a scraper unit, being movably coupled to the guide module, and having a blade module,
     wherein the blade module moves in the forward and backward direction, presses the laminated panel and disassembles the laminated panel; and
   a transfer unit, being coupled to the scraper unit, delivering a driving force to the scraper unit, and transferring the scraper unit,
   wherein the scraper unit includes a press module providing the laminated panel with pressure,
   wherein the press module is positioned above the laminated panel, and
   wherein the press module presses the laminated panel while moving together when the blade module moves in a horizontal direction.

2. The solar cell module disassembling device of claim 1, wherein the frame unit includes:
   a stage, wherein the laminated panel is mounted on the stage; and
   a first support bar, being positioned on an upper surface of the stage, and suppressing a forward movement of the laminated panel.

3. The solar cell module disassembling device of claim 1, wherein the blade module is rotatable and has a different angle with respect to the laminated panel in accordance with a rotation of the blade module.

4. The solar cell module disassembling device of claim 1, wherein the scraper unit further includes at least one among:
   a heating module providing the laminated panel with a heat; and
   an ultrasonic module providing the laminated panel with a ultrasonic wave.

5. The solar cell module disassembling device of claim 1, wherein the press module is positioned in front of the blade module and maintains a distance from the blade module within a certain distance.

6. The solar cell module disassembling device of claim 1, further comprising a sensor unit, wherein the sensor unit measures a thickness of the laminated panel.

7. The solar cell module disassembling device of claim 1, wherein the press module includes a roller, and
   wherein the press module moves forward while rolling when the blade module moves forward.

8. The solar cell module disassembling device of claim 1, wherein the press module incudes a first press rod located in front of the scraper unit and a second press rod located behind the scraper unit.

9. A solar cell module disassembling device comprising:
   a frame unit, wherein a laminated panel having a first panel and a second panel is mounted on the frame unit, and wherein the first and second panels are stacked and bonded;

a guide module, being elongated in a forward and backward direction;

a scraper unit, being movably coupled to the guide module, and having a blade module, wherein the blade module moves in the forward and backward direction, presses the laminated panel and disassembles the laminated panel;

a transfer unit, being coupled to the scraper unit, delivering a driving force to the scraper unit, and transferring the scraper unit; and a blade posture forming assembly for suppressing inclination of the blade module, wherein the blade posture forming assembly includes at least one among:

a height adjustment assembly having a height adjustment module connected to the blade module; and an anti-tilting unit, being coupled to the scraper unit, and being movably coupled to the guide module.

10. The solar cell module disassembling device of claim 9, wherein the scraper unit includes:

a transfer guide support module being coupled to the transfer unit;

the height adjustment module, being coupled to the transfer guide support module, and being capable of adjusting a vertical length of the height adjustment module; and a connecting beam being coupled to the height adjustment module and the blade module.

11. The solar cell module disassembling device of claim 10, wherein the height adjustment module includes:

a height adjustment housing being coupled to the transfer guide support module; and a height adjustment bar, being movably coupled to the height adjustment housing, and being coupled to the connecting beam.

12. The solar cell module disassembling device of claim 10, wherein the height adjustment module includes a front height adjustment module and a rear height adjustment module, and wherein the front and rear height adjustment modules are arranged in the forward and backward direction.

13. The solar cell module disassembling device of claim 9, wherein the anti-tilting unit includes at least one among:

a front anti-tilting module, being coupled to the scraper unit, being positioned in front of the scraper unit, and being movably coupled to the guide module; and a rear anti-tilting module, being coupled to the scraper unit, being positioned in rear of the scraper unit, and being movably coupled to the guide module.

14. The solar cell module disassembling device of claim 9, further comprising an auxiliary roller module having a roller, wherein the roller is positioned in front of the blade module, and wherein the roller rolls onto the laminated panel in front of the blade module in accordance with a movement of the blade module and provides the laminated panel with a pressure.

15. A solar cell module disassembling device comprising:

a frame unit, wherein a laminated panel having a first panel and a second panel is mounted on the frame unit, and wherein the first and second panels are stacked and bonded;

a guide module, being elongated in a forward and backward direction;

a scraper unit, being movably coupled to the guide module, and having a blade module, wherein the blade module moves in the forward and backward direction, presses the laminated panel and disassembles the laminated panel;

a transfer unit, being coupled to the scraper unit, delivering a driving force to the scraper unit, and transferring the scraper unit; and a pre-processing unit, wherein the pre-processing unit removes an upper portion of an area of the laminated panel, wherein the area of the laminated panel is adjacent to an edge of the laminated panel, and wherein the pre-processing unit includes:

a pre-processing movement module being movably coupled to the guide module.

16. The solar cell module disassembling device of claim 15, wherein the pre-processing unit further includes:

a pre-processing support module being extended upwardly from the pre-processing movement module;

a second transverse beam, being coupled to the pre-processing support module, and being elongated transversely with respect to the forward and backward direction; and a pre-processing module, being movably coupled to the second transverse beam, and removing the upper portion of the area of the laminated panel, and wherein the area of the laminated panel is adjacent of the edge of the laminated panel.

17. The solar cell module disassembling device of claim 16, wherein the scraper unit includes:

a scraper movement module being movably coupled to the guide module;

a scraper support module being elongated upwardly from the scraper movement module; and a first transverse beam, being coupled to the scraper support module, and being elongated transversely with respect to the forward and backward direction, and wherein the blade module is coupled to the first transverse beam.

18. The solar cell module disassembling device of claim 15, further comprising a suction unit, wherein the suction unit is positioned in rear of the scraper unit, and wherein the suction unit inhales debris generated while the scraper unit moves forward.

19. A solar cell module disassembling device comprising:

a frame unit, wherein a laminated panel having a first panel and a second panel is mounted on the frame unit, and wherein the first and second panels are stacked and bonded;

a guide module, being elongated in a forward and backward direction;

a scraper unit, being movably coupled to the guide module, and having a blade module, wherein the blade module moves in the forward and backward direction, presses the laminated panel and disassembles the laminated panel;

a transfer unit, being coupled to the scraper unit, delivering a driving force to the scraper unit, and transferring the scraper unit;

a blade unit, being capable of moving with respect to the fame unit, and having a tapered shape; and a drive unit, being coupled to the frame unit, and providing the blade unit with a driving force, wherein the laminated panel includes:
  a solar panel being positioned on a horizontal surface; and
  a junction box being attached to the solar panel, and wherein the blade unit separates the junction box from the solar panel.

20. The solar cell module disassembling device of claim 19, wherein the blade unit includes:

a drive connection portion being coupled to the drive unit;

a support portion, being coupled to the drive connection portion, and being positioned under the drive connection portion; and the blade module, being coupled to the support portion, being positioned under the support portion, and having a tapered shape, and wherein the blade unit accommodates the junction box, when the blade module moves and the junction box is separated from the solar panel.

\* \* \* \* \*